United States Patent
Hirayama et al.

(10) Patent No.: US 9,153,741 B1
(45) Date of Patent: Oct. 6, 2015

(54) ULTRAVIOLET LIGHT-EMITTING DIODE AND ELECTRIC APPARATUS HAVING THE SAME

(71) Applicant: RIKEN, Saitama (JP)

(72) Inventors: Hideki Hirayama, Saitama (JP); Noritoshi Maeda, Saitama (JP); Masafumi Jo, Saitama (JP)

(73) Assignee: RIKEN, Saitama (JP)

(*) Notice: Subject to any disclaimer, the term of this patent is extended or adjusted under 35 U.S.C. 154(b) by 0 days.

(21) Appl. No.: 14/695,786

(22) Filed: Apr. 24, 2015

(30) Foreign Application Priority Data

Apr. 24, 2014 (JP) ................................. 2014-090632
Jan. 30, 2015 (JP) ................................. 2015-017909

(51) Int. Cl.
  H01L 29/06 (2006.01)
  H01L 33/32 (2010.01)
  H01L 33/40 (2010.01)
  H01L 33/04 (2010.01)

(52) U.S. Cl.
  CPC .............. H01L 33/32 (2013.01); H01L 33/04 (2013.01); H01L 33/405 (2013.01)

(58) Field of Classification Search
  CPC ............................. H01L 33/405; H01L 33/04
  USPC ......................................................... 257/13
  See application file for complete search history.

(56) References Cited

U.S. PATENT DOCUMENTS

| 6,023,077 | A * | 2/2000 | Iyechika et al. ............... 257/103 |
| 6,340,824 | B1 * | 1/2002 | Komoto et al. .................. 257/99 |
| 7,811,847 | B2 | 10/2010 | Hirayama et al. |
| 8,759,813 | B2 | 6/2014 | Hirayama |
| 2002/0064195 | A1 * | 5/2002 | Takeya et al. ................... 372/45 |
| 2012/0248456 | A1 | 10/2012 | Takano et al. |

OTHER PUBLICATIONS

Hirayama, H., et al., "231-261 nm AlGaN deep-ultraviolet light-emitting diodes fabricated on AlN multilayer buffers grown by ammonia pulse-flow method on sapphire," Appl. Phys. Lett. 91, 071901 (2007).

Hirayama, H., et al., "222-282 nm AlGaN and InAlGaN-based deep-UV LEDs fabricated on high-quality AlN on sapphire," Phys. Stat. Solidi (a), 206, 1176, (2009).

Fujikawa et al., "Realization of 340-nm-Band High-Output-Power (>7mW) InAlGaN Quantum Well Ultraviolet Light Emitting Diode with p-Type InAlGaN," Japanese Journal of Applied Physics 47(4):2941-2944, 2008.

(Continued)

Primary Examiner — Douglas Menz
(74) Attorney, Agent, or Firm — Seed IP Law Group PLLC

(57) ABSTRACT

To improve light extraction efficiency of a deep ultraviolet light-emitting diode (DUVLED), a typical LED element has a single crystal substrate made of sapphire or AlN, The ultraviolet layer is arranged as a film stack having an n-type conductive layer, a recombination layer, and a p-type conductive layer. A stack of a p-type contact layer and a reflective electrode is disposed on the p-type conductive layer. The ultraviolet emission layer and a p-type contact layer are made of mixed crystal of AlN and GaN. The transmittance for the emission wavelength of the p-type contact layer is increased, and the light extraction efficiency is improved. Also an LED element whose p-type contact layer is configured in a layered structure and whose reflective electrode is patterned is provided. Moreover, an electric appliance having such LED elements is provided.

22 Claims, 15 Drawing Sheets

(56) References Cited

OTHER PUBLICATIONS

Hirayama, "Development and Future of AlGaN base DUV-LEDs," *OPTONEWS* 8(4), 7 pages. (With partial English Translation.).

Maeda et al., "High Efficiency DUV LED Using Transparent p-type AlGaN Contact Layer," Handout from RIKEN Symposium, Saitama, Japan, Oct. 31-Nov. 1, 2013, 4 pages. (With partial English Translation.).

Maeda et al., "Realization of High Efficiency Deep UV LED by using Transparent p-AlGaN Contact Layer," IEICE Technical Report ED2013-83, 2013, 4 pages. With English Abstract.

* cited by examiner

US 9,153,741 B1

ULTRAVIOLET LIGHT-EMITTING DIODE AND ELECTRIC APPARATUS HAVING THE SAME

CROSS-REFERENCE TO RELATED APPLICATIONS

This application is based upon and claims the benefit of priority to Japanese Patent Application No. 2014-090632, filed on Apr. 24, 2014, and Japanese Patent Application No. 2015-017909, filed on Jan. 30, 2015, the contents of which are incorporated herein by reference in their entireties.

BACKGROUND

1. Technical Field

The present disclosure relates to improvement in the light extraction efficiency of ultraviolet light-emitting diodes.

2. Description of the Related Art

Solid state light-emitting elements utilizing a nitride semiconductor material have been widely used in applications of blue light-emitting diodes (LEDs). Similar solid state light-emitting elements are in demand for use in shorter wavelength applications. Thus, ultraviolet light-emitting diodes (UVLEDs) have been developed based on material groups similar to those of blue LEDs. Since ultraviolet (UV) light is considered to have a variety of useful applications including sterilization, water purification, and medical applications, especially so for light at short wavelengths in the deep ultraviolet range of 350 nm or below, or more specifically, in a part of the UVC range of around 260-280 nm, LEDs that operate in the UVC range, and deep UV LEDs (DUVLEDs) are under intensive development. A typical DUVLED uses a sapphire substrate or a single crystal AlN substrate and has a layered structure made of a gallium aluminum nitride series semiconductor containing aluminum (Al), gallium (Ga), and nitrogen (N) for its main composition. Output power of such DUV-LEDs has been improved, and DUVLEDs that output at 10 mW output level UV radiation have been manufactured to date.

Technological challenges for such DUVLEDs include improvement of emission efficiency, as an example. The emission efficiency may be measured by an external quantum efficiency, $\eta_{EQE}$, which is defined as the number of photons emitted by the LED element per unit time, divided by the number of electrons in the operational electric current per unit time. The external quantum efficiency, $\eta_{EQE}$ can be factored into three factors of an internal quantum efficiency $\eta_{IQE}$, an electron injection efficiency $\eta_{EIE}$, and a light extraction efficiency $\eta_{LEE}$, given by the following relationship:

$$\eta_{EQE} = \eta_{IQE} \times \eta_{EIE} \times \eta_{LEE}.$$

Among the three factors for the DUVLEDs the internal quantum efficiency $\eta_{IQE}$ and the electron injection efficiency $\eta_{EIE}$ have been drastically improved to date as a result of continuing development efforts. Specifically, technological solutions that have contributed to such improvement include reduction of crystalline dislocations for the ultraviolet emission layer to improve the internal quantum efficiency $\eta_{IQE}$ (see, for example, U.S. Pat. No. 7,811,847; H. Hirayama et al., "231-261 nm AlGaN deep-ultraviolet light-emitting diodes fabricated on AlN multilayer buffers grown by ammonia pulse-flow method on sapphire," *Appl. Phys. Lett.* 91, 071901 (2007); H. Hirayama et al., "222-282 nm AlGaN and InAlGaN-based deep-UV LEDs fabricated on high-quality AlN on sapphire," *Phys. Stat. Solidi* (a), 206, 1176, (2009); and S, Fujikawa et al., "Realization of 340-nm-band high-output-power (7 mW) InAlGaN quantum well ultraviolet light-emitting diode with p-type InAlGaN", *Jap. J. Appl. Phys.* 47, 2941 (2008)). For the improvement of the electron injection efficiency $\eta_{EIE}$, it is effective to supplement electron blocking performance in a p-type semiconductor layer by adopting a structure called an MQB (multi-quantum barrier) that utilizes a superlattice structure in the p-type semiconductor layer (see, for example, U.S. Pat. No. 8,759, 813). Currently as much as 50-80% efficiency can be expected for a product of the internal quantum efficiency and the electronic injection efficiency, or $\eta_{IQE} \times \eta_{EIE}$.

However, even for DUVLED elements for which a high value of the product of the internal quantum efficiency and the electron injection efficiency $\eta_{IQE} \times \eta_{EIE}$, fabricated DUVLED elements have been operated at an external quantum efficiency $\eta_{EQE}$ of around 4% at the maximum. Such poor performance can be attributed to an insufficient value of the light extraction efficiency, $\eta_{LEE}$. Light extraction efficiencies $\eta_{LEE}$ for conventional DUVLED are typically less than 10%.

BRIEF SUMMARY

The present inventors have sought approaches for improving the light extraction efficiency $\eta_{LEE}$ from a variety of viewpoints. A p-type contact layer electrically coupled to a p-type conductive layer in conventional DUVLED elements, exhibits absorption in a wavelength range of UV radiation, emitted from a UV emission layer. That is, DUVLEDs are manufactured to have a stack on a substrate having a buffer layer, an ultraviolet emission layer, a p-type conduction layer, a p-type contact layer, and a metal electrode, or second electrode, in this order. In addition to these, other layers or parts may be provided as needed, such as an n-type conductive layer between the buffer and the ultraviolet emission layers, and a metal layer, or first electrode, may also be provided for establishing electrical connection with the n-type conductive layer. UV radiation is emitted outwards from both sides of the ultraviolet emission layer. UV radiation that propagates to the substrate side may be extracted to the outside, or the UV radiation may be partially or totally reflected, e.g., especially those components that propagate toward directions related to total internal reflection. On the other hand, UV radiation to the other side, or to the p-type contact layer side, is transmitted through the p-type contact layer, then reflected by the second electrode, and transmitted through the p-type contact layer again in an opposite direction. A portion of the UV radiation entering into the p-type contact layer that survives through absorption and arrives at the substrate in the end can be extracted to the exterior. Since the UV radiation suffers from absorption by the p-type contact layer, the absorption of the p-type contact layer substantially affects the light extraction efficiency $\eta_{LEE}$. A conventional p-type contact layer is typically made of p-type gallium nitride (GaN), because hole concentration can be easily increased in p-type GaN and, accordingly, a good electrical connection can be established. However, due to a significant absorbance of p-type GaN, especially in the deep UV wavelength range, the UV radiation is absorbed for the p-type contact layer including the p-type GaN.

Attention should also be paid to the fact that the absorption in the p-type contact layer precludes using alternative techniques. Even when reflectance of the second electrode is increased, such an approach would not work so long as the absorption in the p-type contact layer is substantial. Similarly, effectiveness of various techniques for extracting the UV radiation transmitted in propagation mode inside is also affected by the decrease of ultraviolet radiation in the propagation mode if the p-type contact layer is substantially absorptive. In order to improve the light extraction efficiency $\eta_{LEE}$ it is imperative to suppress absorption in the p-type contact layer.

The present invention therefore provides DUVLEDs with improved light extraction efficiency $\eta_{LEE}$ and contributes to realize DUVLEDs with high efficiency.

The inventors of the present application have been concerned with the fact that absorption could be weakened by adding Al (aluminum) into the p-type contact layer, similarly as the ultraviolet light emission layer. Also it has been shown, by experimentation, that a DUVLED with a p-type contact layer of such composition could be operated as it should be. The present invention has been made accordingly.

In one aspect of the present invention, provided is an ultraviolet light-emitting diode comprising a single crystalline substrate of sapphire or AlN crystal, an ultraviolet emission layer of mixed crystal of AlN and GaN, a p-type contact layer of mixed crystal of AlN and GaN, and a reflective electrode. The ultraviolet emission layer is disposed in contact with the substrate or an additional buffer layer provided on the substrate. The ultraviolet emission layer is arranged into a stack of layers of at least an n-type conductive layer, a recombination layer, and a p-type conductive layer, in this order from the substrate's side. The p-type contact layer is electrically connected with the p-type conductive layer. The reflective electrode is reflective for a UV radiation emitted from the ultraviolet emission layer. The reflective electrode is disposed in electric connected with the p-type contact layer.

In the present invention, the composition of a mixed crystal of AlN and GaN adopted for the p-type contact layer. It is to be noted that such a mixed crystal of AlN and GaN may also be referred to as AlGaN and that a mixed crystal of $(AlN)_x$ and $(GaN)_{1-x}$ may be referred to as $Al_xGa_{1-x}N$. Additionally, it is to be noted that the mixed crystal of AlN and GaN may contain at least one other component in addition to AlN and GaN.

The band gap of AlGaN is greater than that of GaN, and it can be adjusted by changing Al fraction, or a ratio of AlN in the mixed crystal of AlN and GaN, which is referred to as AlN mixed crystal composition. This nature may be utilized for adjusting an absorption edge of the p-type contact layer that adopts AlGaN as well as transmittance for UV radiation. Moreover, it is easy to adjust transmittance of the p-type contact layer for transmitting the wavelength of the UV radiation from the ultraviolet emission layer if the structure with a mixed crystal of AlN and GaN is adopted for the p-type contact layer. The present invention also takes advantage of this nature.

What should be considered in this adjustment is a carrier concentration in the p-type contact layer. In the case of conventional p-type contact layer a p-type GaN has a sufficient carrier concentration due to Mg doping; therefore electrical connection with the second electrode or the reflective electrode is ensured. Meanwhile, it has been considered difficult to increase the carrier concentration for the AlGaN. That is, it has been considered that increasing AlN mixed crystal composition to match wavelengths of the UV radiation from the ultraviolet light emission layer would usually result in lack of carrier, or reduction of the hole concentration in the p-type conduction layer, because acceptor levels of doped Mg in p-type semiconductor is too deep. This empirical knowledge means that adopting AlGaN for the p-type contact layer as in the present invention causes insufficient carrier concentration; as a result, the electrical connection with the second electrode should be impeded. However, after actually fabricating DUVLED elements with the AlGaN p-type contact layer, the present inventors have confirmed that the light extraction efficiency $\eta_{LEE}$ was considerably improved, and the resulting external quantum efficiency $\eta_{EQE}$ was actually increased. Therefore, adopting AlGaN for the p-type contact layer in the DUVLED elements should be concluded as a promising solution from a practical point of view.

Through the description of the present application, what are important among transmittance values for the p-type contact layer are transmittance values for UV radiation emitted from the ultraviolet emission layer. However, such values for other wavelengths than the emitted UV radiation are also described for clearly explaining the present invention.

It is preferable in the above aspect of the present invention that the transmittance of the p-type contact layer is 90% or more. More preferably, the transmittance is 95% or more. The transmittance of the p-type contact layer in the present application is meant to a value when the effect of the interface reflections subtracted, that is, internal transmittance. The transmittance denotes a single-pass transmittance for passing in a thickness direction, unless otherwise noted. Since the UV radiation propagates in both directions through the p-type contact layer when a second electrode is used for a reflective electrode, the absorption in the p-type contact layer may take place at least two times: one until the rays reach the reflective electrode, and the other after the rays are reflected. Therefore, it is essential to substantially suppress the absorption in the p-type contact layer, or to have sufficiently high transmittance for improving the light extraction efficiency $\eta_{LEE}$. Increasing the transmittance is achieved by increasing Al composition in the p-type contact layer, or increasing the AlN mixed crystal composition ratio.

It is preferable in the above aspect of the present invention that the p-type conductive layer includes an electron blocking layer. More preferably, the electron blocking layer is made of a multi-quantum barrier (MQB). When hole concentration is insufficient, DUVLED elements are prone to reduce their electron injection efficiency $\eta_{EIE}$ due to leak of electron, or overflow of electron from a recombination layer. If an electron block layer is placed downstream side of the electronic flow of the recombination layer, it is possible to increase fraction of electrons associated with the recombination, which improves the electron injection efficiency $\eta_{EIE}$. A typical type of the electron block layer is a single barrier block layer, which is a single layer having raised energy level of the conduction band provided by increasing the AlN mixed crystal composition ratio. Another typical type of the electron block layer is the MQB, which is a more preferable example. In the MQB structure, alternating highs and lows of the energy levels in the conduction band along the thickness direction are provided by stacking multiple layers with different AlN mixed crystal composition ratios, and period of the alternation may be modified along the thickness direction as necessity. A multitude of reflections by the MQB effectively suppress electrons' leaks. Moreover, the MQB is advantageous in preventing hole concentration decrease because it does not always require drastic increase in the AlN mixed crystal composition ratio.

In the above aspect of the preset invention, it is preferable that material of the p-type contact layer is such that it shows a compositional wavelength shorter than a principal wavelength of the UV radiation. The compositional wavelength is one of measures for material of p-type contact layer or its growth condition and is defined as a peak wavelength of photo luminescence of a layer of the same material. The compositional wavelength can be determined based on experiments by preparing a thick layer of the identical material composition and identical growth condition to those for a p-type contact layer to be characterized, and then photo luminescence is measured for the thick layer. Generally speaking, since the compositional wavelength can be a measure of the absorption edge, a wavelength range longer than the compositional wavelength exhibits high transmittance, while a shorter wavelength range exhibits low transmittance. The principal wavelength of the UV radiation, with which the compositional wavelength is to be compared, may denote a range of peak wavelength of the UV radiation. The p-type contact layer exhibits high transmittance at the principal wavelength when the material for the p-type contact layer is determined to make the compositional wavelength shorter than the principal wavelength. Thus it is possible to introduce a good measure for characterizing the p-type contact layer in terms of the above aspect when the compositional wavelength is determined in association with the principal wavelength of the UV radiation. In the present application, a principal wavelength of the UV radiation may be described simply as an emission wavelength.

It is preferable in the above aspect of the present invention that an AlN mixed crystal composition ratio x in a composition $Al_xGa_{1-x}N$ for the p-type contact layer is greater than or equal to a lower limit $x_{min}$ given by $$x_{min} = -0.006W + 2.26,$$

wherein W denotes a principal wavelength of the UV radiation in units of nm. The transmittance mentioned above is achieved when the lower limit of the mixed crystal composition ratio x is determined in association with principal wavelength of the UV radiation. The mixed crystal composition ratio x is a value that satisfies x=0 when the composition includes only GaN without AlN and x=1 when the composition includes only AlN. An expression of $Al_xGa_{1-x}N$ may be used when the composition is denoted in simplified expression similarly as AlGaN. The lower limit value $x_{min}$ of the mixed crystal composition ratio x may be associated with specific wavelengths, such as 0.7 (70%) with 260 nm, and 0.58 (58%) with 280 nm. When the mixed crystal composition ratio x is specified by use of its lower limit value $x_{min}$ defined in the above formula, the advantages of the present invention may be achieved through increased transmittance of the p-type contact layer.

It has been confirmed that the principal wavelength can be shortened to as small as 260 nm by setting the mixed crystal composition ratio x to 0.7. The fact that an efficient UV light source for 260 nm is obtained as disclosed herein is important because, it follows that, a light source of any wavelength selected within 260-280 nm range can be fabricated in accordance with any application needs.

The inventors of the present application have also focused on the fact that the performance of the increased reflectance of the second electrode is limited as long as the transmittance of the p-type contact layer is low. Conversely, the reflection of the ultraviolet light by the second electrode or a reflective electrode considerably improves the light extraction efficiency $\eta_{LEE}$ when the transmittance of the p-type contact layer is kept significant as in the above aspect of the present invention. In the above aspect of the present invention it is advantageous if the reflectance of the reflection electrode is increased.

In an preferred aspect of the present invention, the reflective electrode is a metal film consisting primarily of Al, and the ultraviolet light-emitting diode is provided with an insert metal layer for realizing ohmic contact, the insert metal layer being interposed between the p-type contact layer and the metal film. In conventional UVLED, Au (gold) has been adopted for the reflective electrode. In contrast, Al exhibits higher reflectance in the ultraviolet range. According to this property it is advantageous to adopt a metal film having Al as its main component to increase the reflectance of the second electrode.

Suitable material for the insert metal layer in the above aspect is any metal having large work function. It is preferable that the insert metal layer is made of Ni film with a thickness smaller than 5 nm; it is more preferable that the substantial thickness of the insert metal layer is 1 nm. The material of the insert metal layer is selected for establishing ohmic contact, and selected from, in addition to Ni, palladium (Pd), platinum (Pt), silver (Ag), titanium (Ti), and so on. The metal may be alloy containing at least one of these metal elements and other elements. When a Ni film is adopted, a thinner layer than 5 nm is desirable for higher reflectance. When the substantial thickness is set to 1 nm, it is possible to realize high reflectance while ensuring ohmic contact. Thus, advantageous optical and electrical performance for the DUVLEDs are achieved at the same time. It is to be noted that the term "substantial" thickness as used above is meant to allow for unavoidable errors in the actual film deposition process, such as variation of thickness due to unevenness of the deposition process, or the like. In the case of other metal films than Ni, adjusting film thickness may enable establishment of electrical connection while increasing reflectance.

The present inventors have created a configuration regarding the second electrode that is more advantageous in light extraction efficiency, wherein the configuration has been obtained by combining a reflective electrode and an inserted metal layer. In particular, it is desirable that the insert metal layer is disposed on the p-type contact layer while being patterned in such a manner that a part of the p-type contact layer is covered with the insert metal layer, and that the reflective electrode is placed in direct contact with the p-type contact layer, wherein the insert metal layer is absent and is placed on the p-type contact layer while the insert metal layer is interposed between the reflective electrode and the p-type contact layer where the metal insert is present. Moreover, it is desirable in this configuration that the insert metal layer is either a single-layer metal or a multilayer metal having at least a Ni layer in proximity to the p-type contact layer. In these configurations, it is possible to choose the insert metal layer in consideration of electric performance for realizing ohmic contact, and to choose the reflective electrode in consideration of optical performance or reflection performance for the UV radiation.

Moreover, it is more desirable from the emission efficiency point of view in a configuration having the patterned insert metal layer that the p-type contact layer is configured to have a layered structure in which layers with different AlN mixed crystal composition ratio are stacked with each other. In this configuration, holes propagating through the p-type contact layer from the patterned insert metal layer to the p-type conductive layer are spread toward in-plane directions of the substrate. When a high reflectance reflective electrode is adopted in consideration of optical performances, frequent recombination between electrons and holes will occur at positions where high reflectance due to the reflective electrode can be expected, thus the improvement of the light extraction efficiency is reflected into the overall emission efficiency. It is more desirable in the configuration having the patterned insert metal layer that it further comprises a patterned p-type GaN layer and that a part of the patterned p-type GaN layer is interposed between the p-type contact layer of the layered structure and the patterned insert metal layer while being directly contact with them. When the p-type GaN layer is patterned and in direct contact with the insert metal layer, which is also patterned, then additional degradation of the reflectance is prevented, and the advantageous electric performance due to the p-type GaN layer is utilized. As a result, when the patterned p-type GaN layer is adopted, it is possible to improve power efficiency without loss of optical performance.

Furthermore, in the above aspect of the present apparatus having increased transmittance of the p-type contact layer, it is advantageous to apply various modifications for extracting the UV radiation propagating in waveguide mode. For the LED elements in the above aspect, it is desirable to form voids, or gaps, in the buffer layer. For example, it is possible to fabricate a pillar structure by growing crystals, for portions only, on a number of pattern areas arranged into isolated patterns, or, for portions only, on island areas of the sea-island pattern, within an in-plane cross section of the buffer layer during the crystal growth. In such schemes, voids are formed around the pillars. Also in a quite opposite concept, if the crystal is grown for portions of spacing areas of isolated patterns, or for portions only on sea areas of the sea-island pattern, opening areas is formed. In this case, the opening portions work as voids. In addition to these, the crystal is grown to forming stripe patterns, a number of crystal walls are formed and the sandwiched areas by walls work as voids. It is possible to make a single crystal continuous layer having sufficient crystal quality required for the buffer layer, by closing voids as the crystal grows, by carefully setting the crystal growth conditions. Among the modifications for fabricating voids, it is especially advantageous if "waveguides" formed by the pillars extending along a thickness direction of the element. Since the structure of the element ensures the longitudinal propagation of light through pillars of high aspect ratio, then the light can easily travel inside each pillar. This only requires 2 or 3 times reciprocating passage for the light of waveguide mode in the element to be extracted outside of the elements. It is particularly advantageous if the reflectance of the second electrode is insufficient. It is to be noted that the light is typically extracted after around 10 times reciprocating passage when simple voids are formed, which results in attenuation through the reciprocation. Moreover, it is desirable that the substrate is removed when the LED element is provided with the voids in the buffer layer. For example, if the substrate is removed after the pillars are fabricated, an array of the longitudinal waveguides, each extending in a direction of light extraction, are surfaced, which is highly advantageous.

Furthermore, in the LED element of the above aspect, it is advantageous that the UV radiation has a principal wavelength between 260 nm and 280 nm, inclusive. Moreover, if a moss-eye structure is fabricated on a surface or an interface that accompanies a step in the refractive index, then the surface or interface reflection due to the step in the refractive index is generally diminished. Such a step in the refractive index in the path of the UV radiation propagation, or on the surface through which the UV radiation is extracted, may cause a problem. Thus, it is desirable that the moss-eye structure is fabricated on the surface, which is an opposite surface of the second electrode, or at interface that has a significant step-like difference in the refractive index. Examples of such a surface or an interface may include an outermost surface of the LED element, the interface of a UV transmitting medium and the LED element when the LED element is encapsulated by the UV transmitting medium, such as a resin and glass-like transmissive material.

Moreover, it is preferable that material of the mixed crystal of AlN and GaN for any of the p-type conduction layer further includes In (indium). If In is included in the p-type conductive layer or the p-type contact layer, as well as in an electron barrier layer, the carrier (hole) concentration may be increased.

In addition to the above, it is advantageous that an ultraviolet light-emitting diode in any of the aspects of the present disclosure is adopted in an electric apparatus, which uses the diode as a UV light source. The LED improves practicability of the electric apparatus by increasing the efficiency of the UV light source.

Ultraviolet light-emitting diodes (UVLEDs) denote light-emitting diodes that emit electromagnetic waves in an ultraviolet range i.e., UV light. In the present disclosure, what is provided is a UVLED that mainly emits ultraviolet light at around a wavelength of 220-350 nm wavelength range, or a DUVLED for emitting UV light centered in the deep UV range. Moreover, the present invention provides a DUVLED that emits deep ultraviolet light in a range of sterilization wavelengths, or in the 260-280 nm range. It is to be noted in the present disclosure, that electromagnetic wave emission that is not within the visible light range, such as in the ultra violet range, is also meant by expressions such as "light", "light source", "light emission", "light extraction", and so on, for the purpose of following customary terminology in the field of optics technology.

Furthermore, the ultraviolet emission layer is typically a film stack of AlGaN layers, or a film stack wherein the composition of each layer of the stack is a $Al_yGa_{1-y}N$, wherein y is any value in $0 \leq y \leq 1$, to which a small amount of a dopant element for controlling the conduction carrier type to be positive or negative may be added. The ultra violet emission layer is fabricated generally to have a stack of layers of an n-type conduction layer, a recombination layer, and a p-type conduction layer in this order. In some cases, any layer of the n-type conduction layer, the recombination layer, and the p-type conduction layer itself may be made of laminated films in order to fabricate a quantum well structure, as an example.

According to any aspect of the present disclosure, an ultraviolet light-emitting diode is realized with increased light extraction efficiency $\eta_{LEE}$ by suppressing absorption in the p-type contact layer.

BRIEF DESCRIPTION OF THE DRAWINGS

FIG. 11A is a schematic diagram comparing two sample conditions, and FIG. 11B is a graph showing the spectral dependence of the LEE enhancement factor in one embodiment described herein.

FIG. 12A indicates dependence of the external quantum efficiency $\eta_{EQE}$ on current density, whereas FIG. 12B indicates emission spectra when the external quantum efficiency $\eta_{EQE}$ is maximized.

FIG. 13A indicates dependence of the external quantum efficiency $\eta_{EQE}$ on current density. FIG. 13B is a graph of emission spectra when the external quantum efficiency $\eta_{EQE}$ is maximized.

FIG. 16A is a cross-sectional view of an exemplary sample in which bulk p-type AlGaN is used for the p-type contact layer. FIG. 16B is a cross-sectional view of an exemplary sample in which a layered structure of p-type AlGaN is used for the p-type contact layer.

FIG. 17A is a graph of an exemplary sample in which bulk p-type AlGaN is used as the p-type contact layer. FIG. 17B is a graph of an exemplary sample in which a layered structure p-type AlGaN is used for the p-type contact layer.

DETAILED DESCRIPTION

Figure 1:
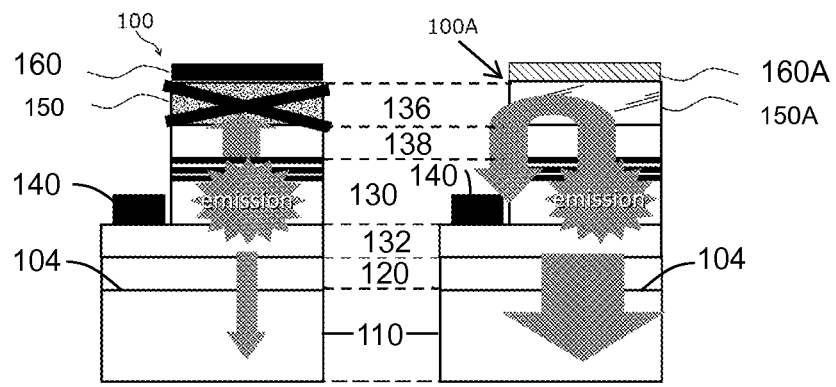
FIG. 1 is a schematic diagram illustrating UV emission according to one embodiment as described herein.

Embodiments regarding an ultraviolet LED element, hereinafter referred to as "LED element," and a manufacturing method are described below, based on the drawings. In the drawings, identical reference numbers identify similar elements or acts. The sizes and relative positions of elements in the drawings are not necessarily drawn to scale.

FIG. 1 illustrates concepts of one embodiment in which an LED element 100 and an LED element 100A, representing conventional and inventive structures, respectively, are shown side-by-side. In both LED elements, light is emitted in all directions from an emission layer 130 formed on a sapphire substrate 110, overlying several intervening layers. In conventional LED elements, a p-type contact layer 136 is made of p-type GaN. Thus UV radiation in the deep ultraviolet part of the emission spectrum is absorbed during propagation through the p-type contact layer 136. The UV transmissive media in both LED elements 100, 100A have refractive index values greater than 2.0. Thus, most of the UV radiation cannot exit from the substrate 110, but propagates inside, in a mode called a waveguide mode. In particular, light that is extracted from the ultraviolet light emission layer 130 directly to the outside without being influenced by reflection or refraction is only light that has propagated within a solid angle subtended by a cone in the medium, which has an apex angle of 20 degrees around a normal to the substrate 110. The solid angle defined by the cone includes only about 8% of the entire volume. It is unlikely that the remaining part of light is extracted to the outside so long as the conventional p-type contact layer 136 is adopted.

In contrast, in the case of the present invention, what is adopted for the material of the p-type contact layer 136 is AlGaN, or a mixed crystal of AlN and GaN that has high transmittance for UV light. Therefore, the absorption of light that passes toward a second electrode 160A is suppressed. The light propagating through the p-type contact layer 136 includes UV radiation directly delivered after emission from the ultraviolet emission layer 130 and light delivered by propagation in waveguide mode inside of the LED element 100A. If the transmittance for UV light in the p-type contact layer 136 is improved, UV radiation emitted toward the second electrode side or UV radiation that could not be utilized in the conventional approach can be redirected to the substrate side. Thus the light in the waveguide mode can also be used without being influenced by unnecessary absorption. That is the concept of the present embodiment.

Figure 2:
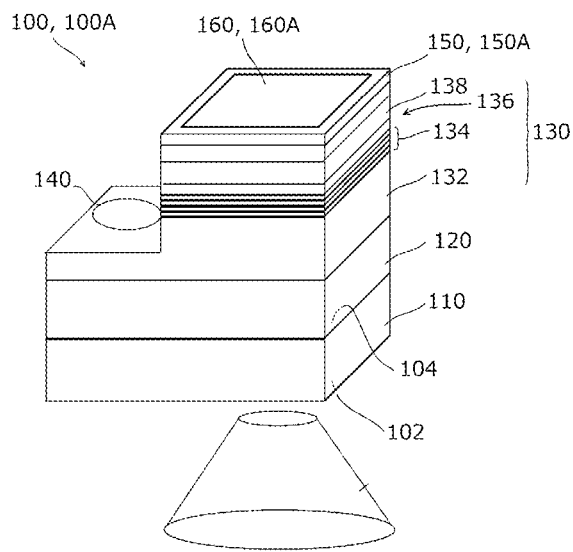
FIG. 2 is a perspective view illustrating the structure common to LED elements, according to one embodiment as described herein.
Figure 3:
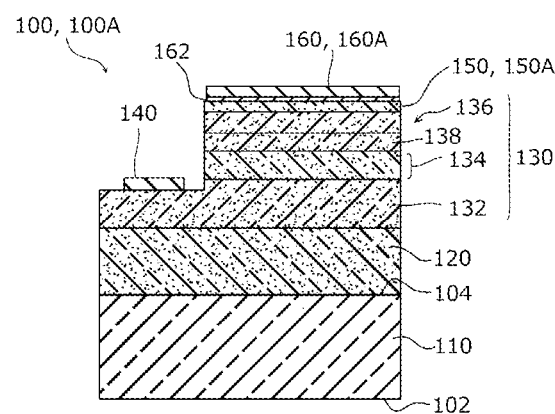
FIG. 3 is a schematic cross-sectional view of the structure common to LED elements in one embodiment as described herein.

FIG. 2 illustrates overall structure common to conventional LED elements and the inventive LED element described herein. FIG. 3 is a corresponding schematic cross-sectional view. In LED elements 100 and 100A, a buffer layer 120 has been grown by epitaxial growth of a material such as AlN crystal or the like on a top surface 104 of the sapphire substrate 110, which is a flat plate of a single crystal of $\alpha$-Al$_2$O$_3$ in general. An ultraviolet emission layer 130 is disposed in contact with the buffer layer 120. The ultraviolet emission layer 130 has been grown by epitaxial growth on the buffer layer 120, too. The structure of the ultraviolet emission layer 130 is common to both the LED elements 100, 100A. Specifically, the structure of the ultraviolet emission layer 130 is, from the buffer layer 120 side, an n-type conduction layer 132, a recombination layer 134, and a p-type conduction layer 136, in this order to form a stack of the layers. A typical material of the ultraviolet emission layer 130 is a composition of AlGaN, while some minor elements may be added, such as silicon (Si) and magnesium (Mg) for n-type and p-type conduction types respectively. A first electrode 140 is electrically connected with the n-type conduction layer 132. For the conduction layer 136 a p-type contact layer 150 and a reflective electrode, which serves as the second electrode 160, are provided in the case of conventional LED element 100. In contrast, in the case of the LED element 100A for the present embodiment, a p-type contact layer 150A is formed on the p-type conduction layer 136, and then a reflective electrode 160A is disposed. The reflective electrodes 160 and 160A establish electrical connection with the p-type conductive layer 136 via the p-type contact layer 150 and 150A respectively. The optical output L is emitted from a lower surface 102 of the sapphire substrate 110.

Detailed structure for the layers is described as follows: The buffer layer 120 has been introduced to grow an AlGaN crystal epitaxially on the sapphire substrate 110. A thickness of the buffer layer 120 is, for example, 2 μm. That is, the buffer layer 120 is adopted to meet requirements from crystal growth point of view for increasing the internal quantum efficiency $\eta_{IQE}$ based on good quality AlGaN layer on the sapphire substrate 110. The buffer layer 120 in the LED element 100A of the present embodiment may be the same as that in the conventional LED element 100.

The n-type conductive layer 132 of the ultraviolet emission layer 130 is, for example, a Si doped $Al_{0.60}Ga_{0.40}N$ layer to realize n-type conduction or $Al_{0.60}Ga_{0.40}N$; Si layer. The recombination layer 134 is an multi-quantum well (MQW) stack body having $Al_{0.60}Ga_{0.40}N$ and $Al_{0.53}Ga_{0.47}N$ films to form a superlattice structure, and the number of quantum wells in the recombination layer 134 is, for example, 3 or so. The p-type conduction layer 136 is AlGaN; Mg layer, or Mg doped AlGaN layer to give p-type conduction property. In the LED element 100A for the present embodiment, electron block layer 138 may be provided optionally in the p-type conduction layer 136. The electron block layer 138 for such a case has, for example, an MQB structure.

In the LED element 100 for the conventional structure, the p-type contact layer 150 has a composition of GaN; Mg and may be referred to as "p-type GaN", which is magnesium doped gallium nitride. In contrast, the p-type contact layer 150A adopted for the LED element 100A in the present embodiment has a composition containing Al, or Mg doped mixed crystal of AlN and GaN (AlGaN). Such material may be referred to as "p-type AlGaN".

In the conventional p-type contact layer 150, the p-type GaN is adopted for operating current injection by establishing an electric connection with the second electrode 160. However, GaN; Mg causes degradation of the light extraction efficiency due to absorption of the UV radiation, as mentioned earlier. In contrast, the p-type contact layer 150A in the present embodiment exhibits a high transmittance because it is made of p-type AlGaN, in which absorption for the UV radiation is suppressed. The inventors of the present application have confirmed that the LED element 100A actually operates properly even in such a structure. The details of this confirmation through experiments will be described in the working examples section below.

A first electrode 140 is a metal electrode having a layered structure of Ni/Au in the order from the lower side. The Ni is a thin layer, such as 25 nm thick, for ensuring ohmic contact inserted between Au and its base layer.

In the case of conventional LED element 100, the reflective electrode 160 has an identical structure to that of the first electrode 140. In contrast, high purity Al or an alloy thereof whose main component is Al is adopted in the LED element 100A for the reflective electrode 160A. This is because the transmittance of the p-type contact layer 150A is increased in the LED element 100A of the present embodiment, and if the reflective electrode 160A has sufficient reflectance, the UV radiation can be extracted to the outside with high efficiency. That is, the reflective electrode 160A works as a reflective film for redirecting the UV light toward the sapphire substrate 110 side. For such purposes, a metal film with Al as a main component having higher reflectance than gold is adopted for the reflective electrode 160A to have high reflectance in the ultraviolet wavelength range. Also in this case, Ni is inserted as the insert metal layer 162 beneath the base side of the reflective electrode 160A in consideration of the electrical functions. However, Ni may decrease UV reflectance if its thickness exceeds 5 nm. Therefore, it is desirable that the thickness of Ni for the insert metal layer 162 in the reflective electrode 160 is less than 5 nm, preferably about 1 nm. Working Example sections also describe details in this respect. It is to be noted that aluminum adopted for the reflective electrode in the embodiments described herein may include Al alloy as well as high purity Al, and such films are referred to as a "metal film with Al for a main component".

Further description will be made for the configuration of the actual LED elements 100 and 100A. These elements generally have a flat plate shape, whose typical dimensions are up to about 100 μm thickness from the buffer layer 120 to the reflective electrode 160 or 160A, and at least 500 μm×500 μm in-plane directions of the LED element 100 or 100A. The refractive index for the UV radiation of the materials comprising the LED element 100 or 100A is significantly higher than that of the surrounding material. Refractive indices for surrounding media, e.g., air or vacuum, and an optional sealing agent of the UV transmitting media are 1 and 1.5, respectively. In contrast, the refractive index of the materials comprising the LED element 100 or 100A is about 2.0 or greater. According to the shape and refractive indices, most of the light emitted by recombination of the conductive carriers in the recombination layer 134 becomes light in the waveguide mode. That is, the light that propagates in directions outside a critical angle from the plane normal of the LED element 100 or 100A cannot be transmitted to the outside from the LED element 100 or 100A due to total internal reflection. For the conventional LED element 100, the waveguide modes are absorbed by the p-type contact layer 150 before they exit, and as a result, they do not contribute to the optical output from the optical output surface 102. The effective light output generated in the recombination layer 134 in the case of the conventional LED element 100, is due to modes that have exited directly from the optical output surface 102, opposite the surface 104 mentioned above. A maximum solid angle within which light can exit directly is 8% of the solid angle extending in all spatial directions. Most of the rest of the light is absorbed in the p-type contact layer 150.

In contrast, for the LED element 100A of the present embodiment, in addition to light that is generated in the recombination layer 134 and emitted toward the optical output surface 102, a substantial light component that is emitted toward the p-type contact layer 150A is extracted outside thereof. Moreover, the waveguide modes may be extracted from the optical output surface 102 so long as they are not absorbed by the p-type contact layer 150A and are redirected by the reflective electrode 160 or 160A. That is, the LED element 100A in the present embodiment can utilize light emitted from both sides of the ultraviolet emission layer 130 and light in the waveguide mode by adopting a weak absorption p-type contact layer 150A combined with reflective electrode 160 A having high reflectance. This is the reason why the total light output from the optical output surface 102 is enhanced and the light extraction efficiency $\eta_{LEE}$ is improved in the LED element 100A.

From this point of view, modifications for efficiently extracting waveguide modes are also useful in the present embodiment. Specifically, direction conversion capability due to scattering or refraction of the UV radiation by forming voids in the buffer layer 120 may be useful for improving the light extraction efficiency $\eta_{LEE}$ in the LED element 100A.

Figure 18:
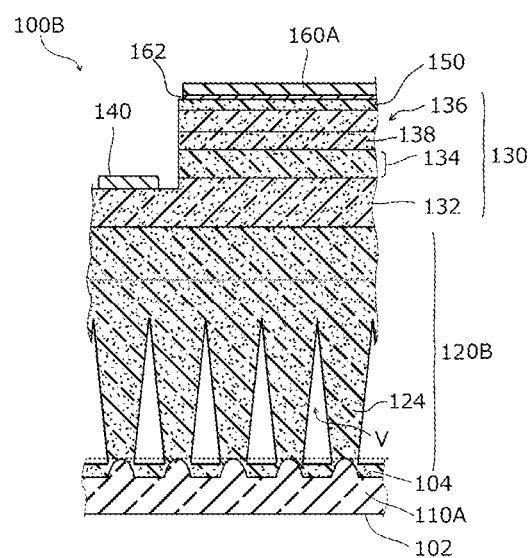
FIG. 18 is a cross-sectional view of a structure of an LED element in one embodiment as described herein.

The buffer layer in this regard may be fabricated into a structure, called a connected pillar AlN buffer structure, for example, as shown in FIG. 18, buffer layer 120B. The structure is one of the structures that satisfy requirements for crystal growth while having direction conversion capability. The present inventors have confirmed that the internal quantum efficiencies $\eta_{IQE}$ for the cases when the buffer layer has such a structure as the connected pillar AlN buffer structure, or more generally, a structure having voids, are comparable with those that lack such a structure. Therefore, voids or pillars that alter the propagation direction of light may give substantial improvement of the light extraction efficiency $\eta_{LEE}$ of the waveguide mode. This concept will be described in further detail below.

Manufacturing Method of LED Elements

Figure 4:
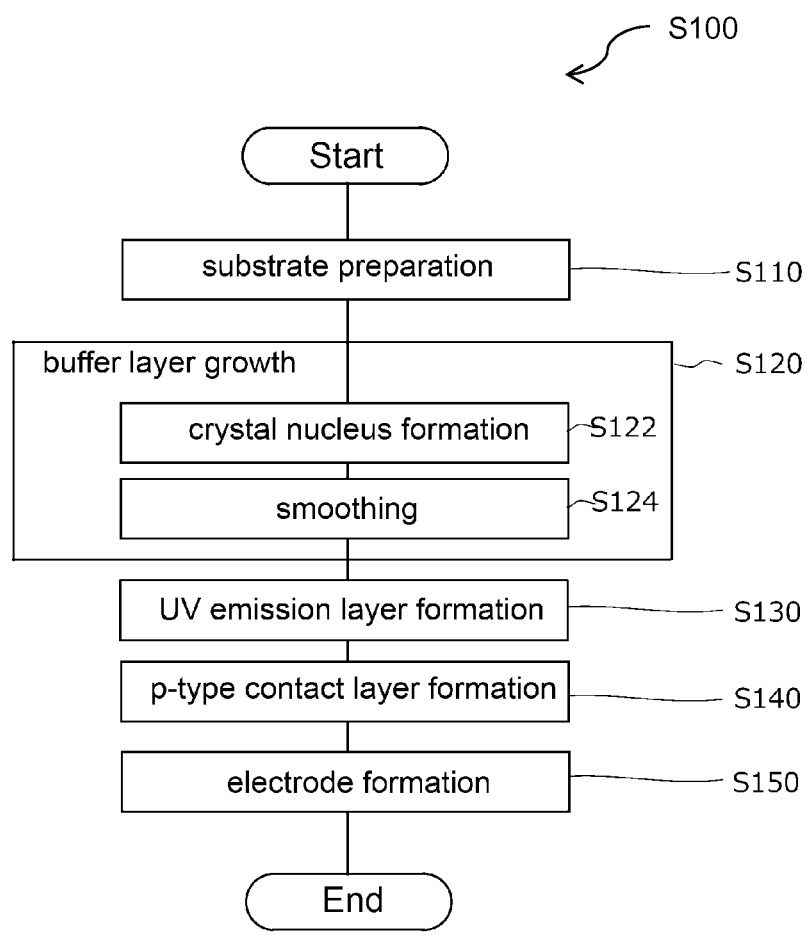
FIG. 4 is a flowchart illustrating a manufacturing method according to one embodiment as described herein.

Next, a manufacturing method for the LED element 100A of the present embodiment will be described. FIG. 4 is a flowchart illustrating a manufacturing method S100, according to one embodiment. The method S100 for manufacturing the LED element 100A in the present embodiment includes a substrate preparation step S110, a buffer layer growth step S120, an ultraviolet emission layer formation step S130, a p-type contact layer formation step S140, and an electrode formation step S150.

First, a sapphire substrate 110 is prepared in the substrate preparation step S110. It is preferable to use a substrate of a single crystal $\alpha$-Al$_2$O$_3$ (0001) face orientation substrate with low dislocation density in the crystal lattice. The sapphire substrate 110 is placed in a reactor of an MOVPE (metalorganic vapor phase epitaxy) apparatus.

Next, the buffer layer 120 is formed through the buffer layer growth step S120. An example of the buffer layer growth step S120 is practiced in two steps: a crystal nucleus formation step S122 and a smoothing step S124. For obtaining the best quality crystal for the buffer layer 120 it is advantageous to apply an approach developed by the inventors of the present application to the crystal nucleus formation step S122 and to the smoothing step S124.

Specifically, granular crystals of AlN are grown in the crystal nucleus formation step S122 under a growth condition that facilitates formation of such tiny pieces of AlN crystals. The formed crystal nuclei function as seed crystals for the subsequent crystal growth. It is preferable that an MOVPE step is adopted, where the MOVPE step supplies ammonia intermittently in time ("ammonia pulse-flow growth method").

In the smoothing step S124, a base crystal layer (not shown in figures) is grown in such a manner that the crystal nuclei are buried. In this step, an ammonia pulse-flow growth method and a simultaneous supply growth scheme are performed at least one time each. The ammonia pulse-flow growth method adopted herein uses a growth condition called an enhanced lateral growth condition, which is different from one in the crystal nucleus formation step S122. It facilitates lateral growth (in-plane direction, or non-polar growth) in a coherent manner with already grown crystal of the crystal nuclei while suppressing formation of new crystal nuclei. The simultaneous supply growth scheme is a rapid growth scheme mainly in a thickness direction while supplying both tri-methyl-aluminum (TMAl) and ammonia gases. It seems that the quality of AlN at this stage may have significant influence on the crystal quality in the subsequent steps. Therefore, it is preferable in the present embodiment that a plurality of repetitive alternation is operated between the ammonia pulse-flow growth method and the simultaneous supply growth scheme, which is called a multi-stage ammonia pulse-flow growth. The number of threading dislocations extending along the thickness direction is decreased by such a repetitive alternation. In an actual growth process, conditions for crystal growth in the MOVPE scheme are precisely controlled. A factor among the crystal growth conditions is, based on the inventors' knowledge, the supply ratio of gases that are V (five) group element, or ammonia, relative to group III elements, or TMAl.

In ultraviolet emission layer formation step S130, the ultraviolet light emission layer 130 is formed whose main component is a composition of $Al_xGa_{1-x}N$, wherein $0<x\leq1$, on a template crystal lattice of the buffer layer 120. The ultraviolet light emission layer 130 is a stack body of the n-type conduction layer 132, the recombination layer 134, and the p-type conduction layer 136 in this order from the buffer layer 120, as depicted in FIG. 1. The raw material gases for forming the n-type conduction layer 132, the recombination layer 134, and the p-type conduction layer 136, may include a variety of gases, such as TESi (tetraethyl silane) for Si, tri-methylgallium (TMGA) or tri-ethyl-gallium (TTEGa) for Ga, and bis-cyclopentadienyl magnesium (Cp2Mg) for Mg, as well as TMAl and ammonia gases. When an electron block layer is provided in the p-type conduction layer 136, the ratio of the gases can be adjusted according to structural details of the electron block layer.

Furthermore, in the p-type contact layer formation step S140, the p-type contact layer 150A is formed for establishing electrical connection. In this step, raw material gases similar to those in the fabrication of the p-type conduction layer 136 may be used. It is to be noted that the conventional p-type contact layer 150 does not require TMAl gases in the p-type contact layer formation step S140 because p-type GaN is formed.

Thereafter, electrodes are formed by the electrode formation step S150. This step is to form the first electrode 140 and the second electrode 160A. For example, the first electrode 140 is formed on the surface of the n-type conduction layer 132. Further on the surface of the p-type contact layer 150A, the reflective electrode 160A is formed as the second electrode. The insert metal layer 162 may be disposed as necessary before the reflective electrode 160A is formed.

WORKING EXAMPLES

A first embodiment will be described in further detail based on several working examples. The specific details including materials, amounts, ratios of constituents, process details, process order, orientation, and configuration of elements or parts in the description of the following examples can be modified as necessity without departing from the scope of the present invention. Therefore, the scope of the present invention is not limited to the examples described below. In the drawings, identical reference numbers identify similar elements or acts.

Working Example 1

Operability Confirmation of P-Type Contact Layer

Working Example 1 is described regarding operability of the p-type contact layer 150A with respect to electric performance. Although p-type AlGaN is adopted for the p-type contact layer 150A in the Working Example 1, it should be noted that low reflectance configuration with an insert metal layer 162 and reflective electrode 160 is adopted as the second electrode, as in the conventional configuration.

Figure 5:
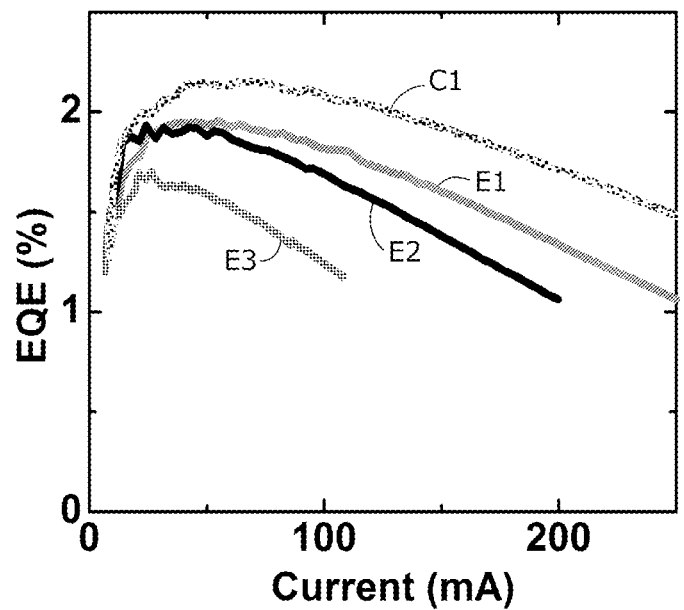
FIG. 5 is a graph of external quantum efficiency $\eta_{EQE}$ dependence on the electric current density obtained from four samples having different AlN mixed crystal composition ratios in an AlGaN p-type contact layer, according to one embodiment as described herein.

FIG. 5 is a graph depicting external quantum efficiency $\eta_{EQE}$ dependence on the electric current density for operated samples with different AlN mixed crystal composition ratio in the p-type contact layer 150A in an example, Working Example 1, that adopts AlGaN for the p-type contact layer 150A. The measurement was carried out for continuous emission operation at room temperature. In the description, samples prepared for this working example are referred to as Example Sample E1 and so on, whereas a sample for a comparative example is referred to as Comparative Sample C1. Several conditions for fabricating each sample are listed in Table 1. The p-type conduction layer 136 for each sample was made with an electronic block layer 138 with MQB structure only.

TABLE 1

| FIG. | Sample | Emission WL (nm) | Electron Block Layer | Second Electrode | p-type contact layer | |
|---|---|---|---|---|---|---|
| | | | | | C. WL (nm) | AlN M/C Fr. (%) |
| 5 | Comp. C1 | 265 | MQB | Ni/Au | 360 | 0 |
| 5 | Ex. E1 | 265 | MQB | Ni/Au | 290 | 47 |
| 5 | Ex. E2 | 265 | MQB | Ni/Au | 275 | 56 |
| 5 | Ex. E3 | 265 | MQB | Ni/Au | 270 | 60 |
| 6 | Ex. E4 | 277 | MQB | Ni/Au | 270 | 60 |
| 6 | Ex. E5 | 277 | MQB | Ni/Au | 265 | 63 |
| 10 | Ex. E6 | 279 | MQB (Opt) | Ni/Au | 270 | 60 |
| 10 | Ex. E7 | 279 | MQB (Opt) | Ni/Al | 270 | 60 |
| 12 | (Ex. E7) | 279 | MQB (Opt) | Ni/Al | 270 | 60 |
| 12 | Ex. E8 | 277 | MQB (Opt) | Ni/Al | 270 | 60 |
| 12 | Ex. E9 | 275 | MQB (Opt) | Ni/Al | 270 | 60 |

Legend: Ex.: Example Sample;
Emission. WL: Emission Wavelength;
MQB (Opt): MQB optimized;
Ni/Au: Ni(25 nm)/Au(150 nm);
Comp.: Comparative Sample;
C. WL: Composition Wavelength;
AlN M/C. Fr.: AlN mixed-crystal fraction
Ni/Al: Ni(1 nm)/Al(150 nm)

One LED element for each sample was prepared according to the manufacturing method mentioned above. In Working Example 1, Comparative Sample C1, and Example Samples E1-E3 are fabricated. These samples are made to have an emission wavelength of 265 nm as the principal wavelength of UV radiation, and their p-type conductive layers 136 are electron block layers 138 with a multi-quantum barrier (MQB). Their insert metal layers 162 and reflective electrodes 160 corresponding to the second electrodes are Ni/Au, which is the same as the conventional configuration mentioned above. It follows that differences between the samples should be found only in the p-type contact layer. Specifically, p-type GaN was adopted for the conventional p-type contact layer 150 of Comparative Sample C1. The AlN mixed crystal composition ratio for the p-type GaN is 0%. In contrast, p-type AlGaN was adopted in Example Samples E1-E3 for their p-type contact layers 150A. The AlN mixed crystal composition ratios for Example Samples E1-E3 are 47%, 56%, and 60% respectively. Table 1 also lists compositional wavelengths that were derived by measuring photo luminescence at room temperature for thick films prepared with compositions and conditions identical to those for the p-type contact layers. Moreover, measured values of the external quantum efficiency $\eta_{EQE}$ for these samples are indicated in the graph of FIG. 5.

As found in FIG. 5, it was confirmed that Example Samples E1-E3 showed sufficient operability as LED elements. By comparing Comparative Sample C1 and Example Samples E1-E3 with one another, we found that, in terms of electrical performance, Comparative Sample C1 is the most advantageous, Example Sample E1-E3 followed in this order. That is, Comparative Sample C1 has the highest external quantum efficiency $\eta_{EQE}$. However, it should be emphasized that none of the LED elements for Example Samples E1-E3 had difficulty in operation.

Figure 6:
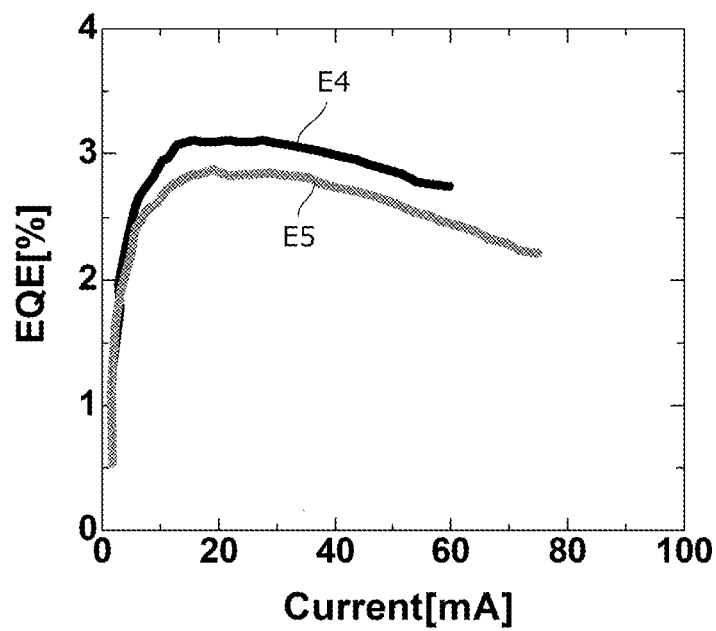
FIG. 6 is a graph depicting external quantum efficiency $\eta_{EQE}$ dependence on the electric current density obtained from two additional samples with different AlN mixed crystal composition ratios in an AlGaN p-type contact layer, according to one embodiment as described herein.

Then we studied similar properties of LED elements made using a 277 nm emission wavelength, which had been increased slightly within the range of wavelengths for sterilization, 260-280 nm. FIG. 6 is a graph depicting external quantum efficiency $\eta_{EQE}$ dependence on an electric current density for operated samples with different AlN mixed crystal composition ratio in a p-type contact layer for a working example that adopts AlGaN for the p-type contact layer 150A. There is a difference between FIGS. 5 and 6 in that, the composition wavelength of the p-type contact layer 150A is longer than an emission wavelength in the case of FIG. 5, whereas the relationship of the composition wavelength of p-type contact layer 150A and the emission wavelength is reversed in FIG. 6. Therefore, Example Samples E4 and E5 have a shifted amount of AlN mixed crystal composition ratio x for the p-type contact layer 150A so that their composition wavelengths are shorter than their own emission wavelengths. Conditions regarding these samples are also listed in Table 1. The measurement was carried out with continuous emission operation at room temperature as in FIG. 5. The composition wavelengths for the p-type contact layers 150A for Example Samples E4 and E5, which correspond to AlN mixed crystal composition ratio x of 60% and 63%, were 270 nm and 265 nm, respectively.

The LED elements of the Example Samples E4 and E5 having composition wavelengths of the p-type contact layer 150A shorter than their own emission wavelengths have operated without any difficulty. To the inventors' knowledge, no operable DUVLED element has been reported before with an AlN mixed crystal composition ratio x of as high as 60% and 63% for the p-type contact layer 150A. In addition to that, the external quantum efficiency $\eta_{EQE}$ of 3% is considered to be a sufficiently high value for LED elements having a 277 nm emission wavelength. It was observed that the external quantum efficiency $\eta_{EQE}$ decreases according to increase of AlN mixed crystal composition ratio x in an identical wavelength of the UV radiation for these samples, too.

The p-type contact layers 150A in Example Samples E4 and E5 both have some level of transmittance for 277 nm wavelength; the transmittance is expected to increase with an increase in AlN mixed crystal composition ratio x, or with a decrease in the composition wavelength. However, excessive increase of the AlN mixed crystal composition ratio x does not necessarily lead to an acceptable result. A side effect concerning electrical connection caused by the increase of AlN mixed crystal composition ratio x, or lack of hole concentration of the p-type contact layer 150A, may be problematic. Therefore, the AlN mixed crystal composition ratio x in the p-type contact layer 150A needs to be adjusted appropriately in consideration of the wavelength of the UV radiation. Attention should be paid to the fact that sufficient operability indicated in FIG. 6 is confirmed, even though the insert metal layer 162 and the reflective electrode had a Ni/Au structure, which is not expected to yield sufficient reflection. It follows that the problem of the electrical properties of the p-type contact layer 150A may be overcome.

As stated above, sufficient operability has been confirmed even when material composition of a p-type contact layer 150A contains Al. Moreover, it is now known that the relationship between the emission wavelength and Al composition of the p-type contact layer 150A is specified by the composition wavelength.

17

Working Example 2

Transmission Characteristics of P-Type Contact Layer

Figure 7:
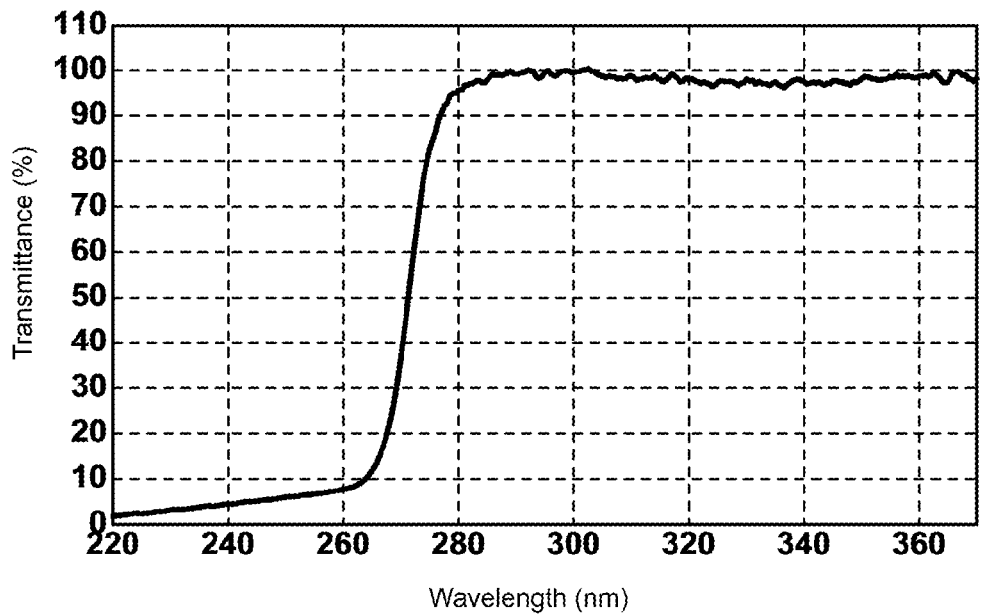
FIG. 7 is a graph of a transmittance spectrum of a film formed with material and growth conditions that are substantially the same as those for the p-type contact layer adopted in one embodiment, as described herein.

In Working Example 2, transmittance measurements were conducted regarding materials for the p-type contact layer 150A to confirm optical characteristics of candidate materials for adoption as the p-type contact layer 150A. FIG. 7 is a graph depicting a transmittance spectrum of a film made of material identical to that of the p-type contact layer 150A. The measured film sample is AlGaN formed on an AlN buffer layer supported by a sapphire substrate, having the same condition as that of the p-type contact layer 150A with an AlN mixed crystal composition ratio x of 0.6, or 60%, corresponding to a compositional wavelength of 270 nm, wherein the AlN buffer has been deposited for epitaxial growth purposes. The measurement sample had an AlGaN layer twice as thick as the p-type contact layer 150A in the actual device, for precise measurement. To calculate internal transmittance excluding interface reflections, reflectance was also measured from the sample. As a result, high transmittance as high as 94% at 279 nm was confirmed in the case of AlN mixed crystal composition ratio x of 0.6, corresponding to 270 nm composition wavelength, for the measurement sample of the transmittance. This value for the twice thickness film is equivalent to a transmittance of 97% at 279 nm for the p-type contact layer 150A with AlN mixed crystal composition ratio x of 0.6 The UV radiation of 279 nm may be a realistic wavelength, as will be described in another example. In addition, the AlN mixed crystal composition ratio x of 0.6 is not particularly problematic in operation, regarding electric performance, as mentioned in the Working Example 1. Thus, it has been confirmed that the internal transmittance of the p-type contact layer 150A exceeds 90% at a wavelength of the UV radiation, and that the internal transmittance actually exceeded 95%. Moreover, it has been confirmed that a wavelength for which the transmittance drops drastically shifts when the AlN mixed crystal composition ratio x, or the composition wavelength, is changed.

Figure 8:
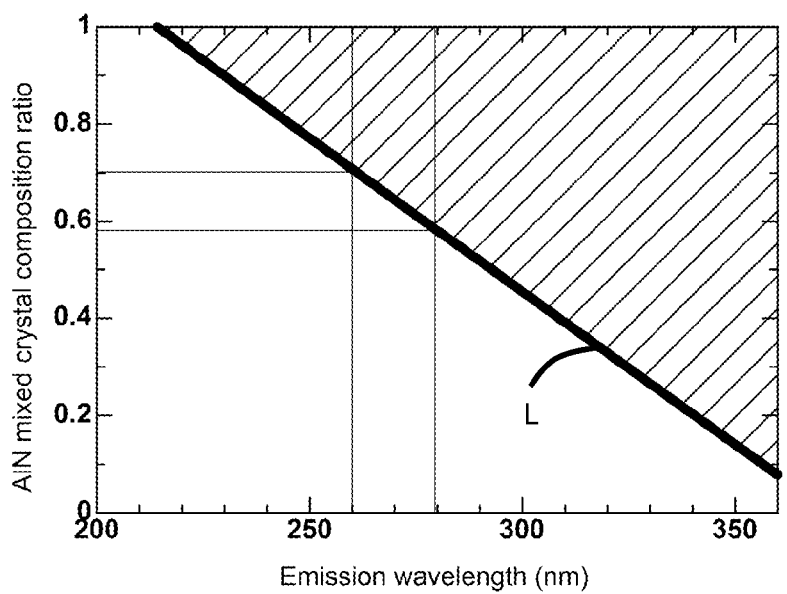
FIG. 8 is a schematic diagram indicating an AlN mixed crystal composition ratio dependence on wavelength of UV radiation in a p-type contact layer adopted in one embodiment, as described herein.

Next, the relationship between the emission wavelength and the AlN mixed crystal composition ratio of the p-type contact layer 150A that is suitable for the emission wavelength has been clarified. As mentioned earlier, it is preferable that the AlN mixed crystal composition ratio is set as small as possible from the electric performance viewpoint. On the other hand, there should be a lower limit for the AlN mixed crystal composition ratio to fabricate a p-type contact layer 150A with high transmittance. The present inventors of the present application tried to associate a range of preferable AlN mixed crystal composition ratio with emission wavelength of LEDs. FIG. 8 is a schematic diagram indicating the AlN mixed crystal composition ratio dependence on the wavelength of UV radiation in the p-type contact layer 150A adopted in the present embodiment.

In a typical application field of the LED elements in the present application, or the sterilization application, it is desirable that the emission wavelength of the LED is 260 nm-280 nm. Also, it is desirable that AlN mixed crystal composition ratio adopted in the p-type contact layer 150A is 70% or more for LEDs, at an emission wavelength of 260 nm, and 58% or more at 280 nm. However, this concept can be useful for LEDs with emission wavelengths outside the range of about 260 nm-280 nm, which is also depicted in FIG. 8. In particular, it is desirable for the AlN mixed crystal composition ratio x to be greater than or equal to a lower limit $x_{min}$ given by $$x_{min} = -0.0060W + 2.26,$$

wherein W denotes a value of a principal wavelength of the UV radiation, in units of nm. It is preferable that the AlN mixed crystal composition ratio x is chosen for each wavelength from within the hatched area in FIG. 8. The $x_{min}$ provided by the above formula corresponds to a straight line L shown in FIG. 8.

Working Example 3

Reflection Characteristics of Second Electrode

Figure 9:
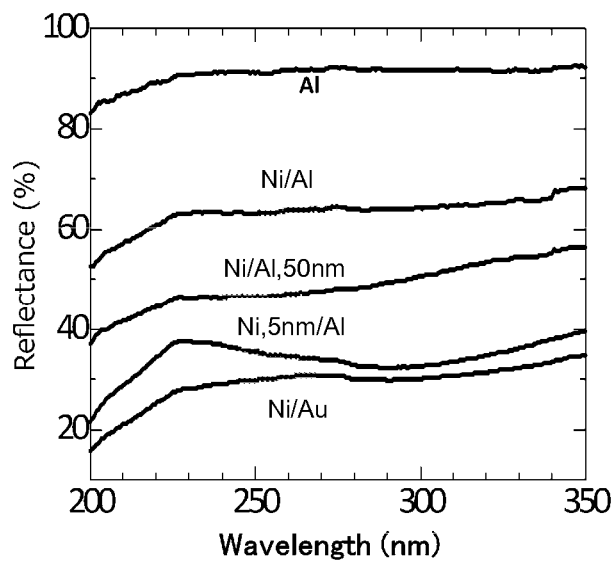
FIG. 9 depicts reflection spectra of various metal films for an insert metal layer and a reflection electrode that serve as the second electrode in one embodiment, as described herein.

In Working Example 3, reflection enhancement by the second electrode was attempted. FIG. 9 depicts reflection spectra of various kinds of metal films used for the insert metal layer and the second electrode 160A. After forming metal films on sapphire substrates, a measurement was carried out of the reflection spectra for light incident on metal films from the sapphire substrate side, to obtain measured values for incidence and reflection from the p-type contact layer 150A side of the second electrode formed on the p-type contact layer 150A. When the Al film only is disposed with sufficient thickness on a sapphire substrate, reflectance of about 91% at 270 nm was measured. In contrast, reflectance of Ni(25 nm)/Au(150 nm), which has been adopted for the conventional insert metal layer 162 and reflective electrode 160, was 30% at 270 nm. The expression Ni(25 nm)/Au(150 nm) defines a metal film stack that consists of a 25 nm thick Ni, disposed first, and 150 nm thick Au, deposited thereafter in contact with the Ni layer. This result shows that the conventional reflective electrode 160 may need to be improved. The inventors of the present application studied optical effects caused by Ni, which is used as an insert metal layer, while keeping the high reflectance of Al.

First, a 5 nm thick Ni layer was formed and capped by a 100 nm thick Al layer. The reflectance therefrom was 34% at 270 nm, substantially equivalent to Ni/Au. From this result, it can be inferred that the problem should come from low reflectance of Ni. Next, the thickness of Ni was reduced to 1 nm. The resulting reflectance became as high as about 64% when the Ni was combined with 100 nm thick Al. In addition, even when thickness of Al was increased over 100 nm, the reflectance was substantially unchanged. Conversely, when the thickness of Al was decreased to about 50 nm, the reflectance diminished to about 47%. Based on the foregoing, it can be concluded that satisfactory reflectance is achieved if substantial thickness of Ni for the insert metal layer 162 is set to 1 nm or the like while Al is adopted as the reflective electrode 160A. It is also advantageous to form a thick Al layer for the reflective electrode 160A, in consideration of electrical properties.

The graph in FIG. 9 depicts results for samples dedicated to reflectance measurement. However, the same trend should be found in the actual LED elements. That is, the second electrode of Ni/Au structure in actual LED elements will have reflectance as low as 10-30%, whereas Ni/Al structure yields reflectance of about 64%. In addition, if a contact electrode is made of Pd, Pt, Ag, or Ti while controlling its thickness, then a high reflectance of 70% or more can be expected.

Working Example 4

Demonstration of Device Operation as LED Elements

In Working Example 4, practicability was demonstrated for an LED element 100A having a p-type contact layer 150A with increased transmittance and a second electrode with increased reflectance. Specifically, two improvements were confirmed in such an LED element 100A: the light extraction efficiency $\eta_{LEE}$ was actually improved, and the external quantum efficiency $\eta_{EQE}$ was improved. It should be noted in samples of the LED element 100A of Working Example 4 that the structure of MQB had been optimized over the Example Samples described above. The optimization was done for two reasons. One is that degradation of electron injection efficiency $\eta_{EIE}$ is expected due to a leak of electrons, or overflow, caused by insufficient hole concentration associated with an increase of transmittance in the p-type contact layer 150A, or increased AlN mixed crystal composition ratio x. The other reason is to take advantage of potential performance of the LED element 100A in the present embodiment. The optimization was carried out specifically through enhancing electron blocking capability by increasing the barrier height of the MQB placed in the p-type conduction layer 136. The p-type contact layer 150A with improved transmittance can be sufficiently utilized by an electron blocking layer such as the MQB, even if such transmittance improvement brings disadvantages in electric performances, or a decrease in the electron injection efficiency $\eta_{EIE}$.

Figure 10:
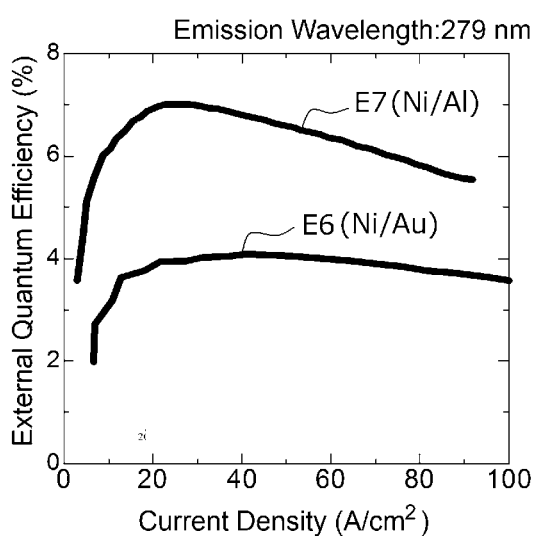
FIG. 10 is a graph of measured data showing performance improvement modifying the second electrode in a working example of one embodiment, as described herein.
Figure 11A:
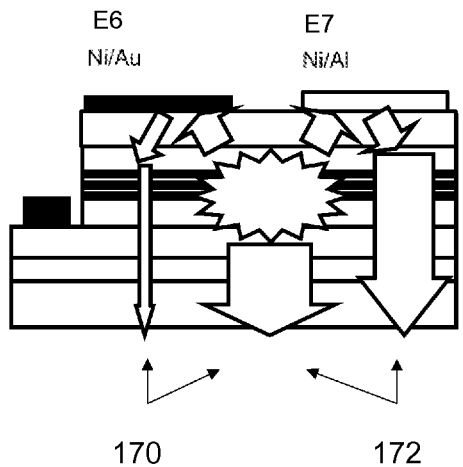
FIGS. 11A and 11B illustrate a comparison of the external quantum efficiency $\eta_{EQE}$ when the second electrode is replaced by an electrode having higher reflectance in a working example of one embodiment as described herein.
Figure 11B:
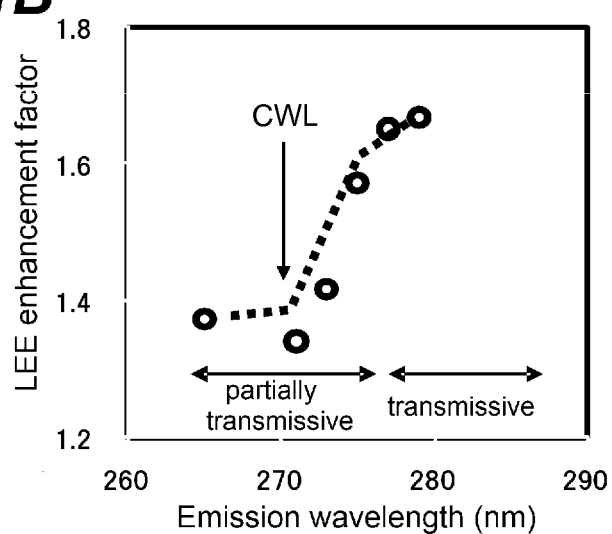

FIG. 10 is a graph indicating actually measured improvement of the performances by modifying only the second electrode in the present Working Example. Moreover, FIG. 11 illustrates a change of the external quantum efficiency $\eta_{EQE}$ when the second electrode is replaced by higher reflectance one in the present Working Example. Specifically, FIG. 11A is a schematic diagram illustrating sample conditions of samples compared with each other, and FIG. 11B indicates a graph associated thereto. The conditions for each sample are listed in Table 1. To demonstrate improvement of the light extraction efficiency $\eta_{LEE}$ due to the combination of the p-type contact layer 150A with increased transmittance and the second electrode with increased reflectance, the inventors of the present application fabricated samples while changing the configuration of the second electrode, as schematically illustrated in FIG. 11A, and studied the light extraction efficiency $\eta_{LEE}$ influenced by such a change in the configuration.

Specifically, relationships between the current density and the external quantum efficiency $\eta_{EQE}$ were studied using a sample having the second electrode of Ni/Au (Example Sample E6) and another sample the second electrode of Ni/Al (Example Sample E7), as in FIG. 10. The left side of FIG. 11A depicts inefficient extraction 170 that results from a configuration that includes a low reflectance Ni/Au second electrode E6. The right side of FIG. 11A depicts efficient extraction 172 that results from a configuration that includes a high reflectance Ni/Al second electrode E7. The samples were made to have their own ultraviolet emission layer 130 such that their emission wavelengths are 279 nm, and were made to have their own p-type contact layer 150A such that their compositional wavelengths are 270 nm, or their AlN mixed crystal composition ratio x of 60%. The measurement was carried out through continuous operation at room temperature. The maximum value of the external quantum efficiency $\eta_{EQE}$ was increased from 4.1% to 7.0%, a 167% improvement, by changing the second electrode from Ni/Au for Example Sample E6 to Ni/Al for Example Sample E7.

The foregoing result is important for two reasons. First, the external quantum efficiency $\eta_{EQE}$ is actually as high as 7.0% at a wavelength of 279 nm, which is within a range of sterilization wavelengths. Second, experimental evidence supports a direct relationship between the difference in performance of the second electrodes' reflectance and LED elements, which relationship could be observed due to the increased transmittance of the p-type contact layer 150A. In the present Working Example, it was confirmed that the light extraction efficiency $\eta_{LEE}$ was improved by combining the p-type contact layer 150A with increased transmittance having AlN mixed crystal composition ratio of 60% and the second electrode with increased reflectance.

Additionally, the result in FIG. 10 suggests a detailed relationship between composition of the p-type contact layer 150A and emission wavelength in the operation of the LED elements. FIG. 10 shows that p-type contact layer 150A with AlGaN of compositional wavelength 270 nm (AlN mixed crystal composition ratio x of 60%) has high transmittance at emission wavelength of 279 nm, and that the high reflectance is actually achieved in the second electrode. As mentioned earlier with reference to FIG. 7, the transmittance spectrum of the p-type contact layer 150A depends on its AlN mixed crystal composition ratio x, or on compositional wavelength. Therefore, improvement amount of the external quantum efficiency $\eta_{EQE}$ depending on the second electrode reflectance is influenced by a combination of composition of the p-type contact layer 150A and an emission wavelength. In consideration of this point, the improvement amounts of the external quantum efficiency $\eta_{EQE}$ by the reflectance of the second electrode were calculated and plotted in FIG. 11B for wavelengths in the case of emission wavelength depicted in FIG. 10, or 279 nm. The value denoting the improvement amount is called the LEE enhancement factor. The LEE enhancement factor is an external quantum efficiency $\eta_{EQE}$ for the high reflectance second electrode (Ni/Al, with 1 nm thick Ni) divided by an external quantum efficiency $\eta_{EQE}$ for the original, low reflectance second electrode (Ni/Au). The samples measured are ones fabricated to have different emission wavelengths while the material of the p-type contact layer 150A was unchanged, whose compositional wavelength of 270 nm corresponding to AlN mixed crystal composition ratio x of 60%. The result is indicated in FIG. 11B. FIG. 11B depicts LEE enhancement factors for six emission wavelengths, 279, 277, 275, 273, 271, and 265 nm. Among these wavelengths, the result for 279 nm was obtained from substantially identical combination of Example Samples E6 and E7 in FIG. 10.

As indicated in FIG. 11B, the LEE enhancement factors for structures having shorter emission wavelengths were about 1.3-1.4 of the composition wavelength CWL of 270 nm for the p-type contact layer 150A. In contrast the LEE enhancement factor was 1.7, at the maximum, for structures having longer emission wavelength than the composition wavelength.

This result supports an understanding that the contribution of the second electrode's reflectance to the external quantum efficiency $\eta_{EQE}$ is small for a low reflectance p-type contact layer 150A, whereas it is significant for a high reflectance one. This is easily understood in view of the transmission spectrum indicated in FIG. 7. Although the reflection spectrum of the metal film for the second electrode only has a mild dependence on the wavelength, the transmission spectrum of the p-type contact layer 150A changes drastically over a wavelength range as in FIG. 7. The LEE enhancement factor dependence on the emission wavelength also changes drastically at around the composition wavelength CWL, which means that the transmittance of the p-type contact layer 150A contributes significantly to the light extraction efficiency $\eta_{LEE}$. As stated above, it is confirmed that the p-type contact layer 150A with increased transmittance has contributes significantly to improvement of the light extraction efficiency $\eta_{LEE}$.

Figure 12A:
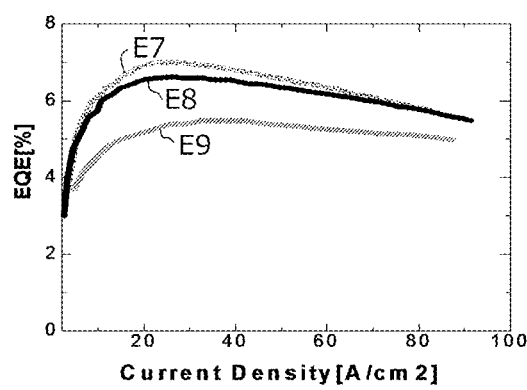
FIGS. 12A and 12B depict graphs indicating measured data showing performance in a working example of one embodiment as described herein when a different ultraviolet emission layer having a different emission wavelength is adopted as the p-type contact layer.
Figure 12B:
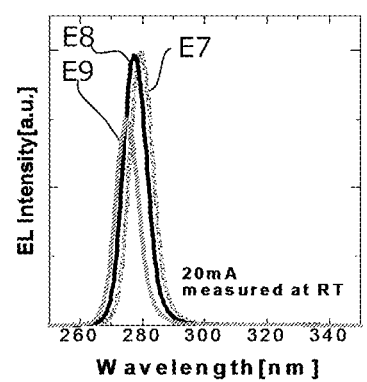

Further experimental confirmation is gained by changing the emission wavelength while keeping the material of the p-type contact layer 150A unchanged. FIG. 12 depicts graphs indicating measured performance in an example of an embodiment in which different ultraviolet emission layers having different emission wavelengths and a common p-type contact layer are adopted. FIG. 12A indicates dependence of the external quantum efficiency $\eta_{EQE}$ on current density, whereas FIG. 12B shows emission spectra when the current density is 20 mA/cm$^2$, when the external quantum efficiencies $\eta_{EQE}$ are almost maximized. In particular, FIGS. 12A and 12B show dependence of external quantum efficiency $\eta_{EQE}$ on current density of Example Sample E7, which has emission wavelength 279 nm, by adopting Ni/Al for the second electrode. Results for Example Samples E8 and E9, shown in FIG. 11, have emission wavelengths of 277 nm and 275 nm. It is confirmed that high external quantum efficiencies $\eta_{EQE}$ are achieved for an emission wavelength longer than a compositional wavelength even when the emission wavelength is shifted relative to the compositional wavelength of the p-type contact layer 150A. This has been confirmed by measurements of external quantum efficiency $\eta_{EQE}$. Secondly, a quantitative relationship has been confirmed. That is, based on a comparison of Example Samples E9, E8, and E7 having respective emission wavelengths of at least 5 nm, 7 nm, and 9 nm longer than the composition wavelength of 270 nm, the longer the emission wavelength is, the higher the external quantum efficiency $\eta_{EQE}$ becomes. Therefore, it is desirable that the value of the difference, λ emission–λ composition, is set to approximately 7 nm, and preferably around 9 nm.

Working Example 5

Demonstration of Shorter Wavelength Example

To demonstrate operation at shorter wavelengths within 260-280 nm spectral range, the inventors of the present application fabricated light emitting devices of ~260 nm. Specifically, Example Samples E10 and E11 are fabricated according to conditions listed in the Table 2.

TABLE 2

| FIG. | Sample | Emission WL (nm) | Electron Block Layer | Second Electrode | p-type contact layer | |
|---|---|---|---|---|---|---|
| | | | | | C. WL (nm) | AlN M/C. Fr. (%) |
| 13 | Ex. E10 | 260 | MQB (Opt) | Ni/Au | 240 | 70 |
| 13 | Ex. E11 | 260 | MQB (Opt) | Ni/Al | 240 | 70 |

Legend: Ex.: Example Sample;
Emission. WL: Emission Wavelength;
AlN M/C. Fr.: AlN mixed-crystal fraction;
Ni/Au: Ni(25 nm)/Au(150 nm);
MQB (Opt): MQB optimized;
C. WL: Composition Wavelength
Ni/Al: Ni(1 nm)/Al(150 nm)

In summary, in contrast to the LED elements 100A for Example Samples E1-E9, the emission wavelengths for the Example Samples E10 and E11 were set to 260 nm and accordingly the AlN mixed crystal composition ratio x was increased to 70%. The relationship between the emission wavelength of 260 nm and the AlN mixed crystal composition ratio x of 70% (0.7) corresponds to the minimum value $x_{min}$, defining the preferable AlN mixed crystal composition ratio x range corresponding to 260 nm emission wavelength as indicated in FIG. 8.

The p-type contact layers 150A in the Example Samples E10 and E11 were made 100 nm thick while adjusting the Mg dopant concentration to about 5×10$^{19}$ cm$^{-3}$. With the p-type contact layers 150A based on these conditions, transmittance was measured similarly as in FIG. 7. It was found that the resulting absorption spectrum was shifted by about 30 nm to shorter wavelengths compared with FIG. 7, and there was little absorption at wavelengths over 250 nm. The corresponding composition wavelength is around 240 nm. The second electrodes were Ni/Au and Ni/Al, for Example Samples E10 and E11, respectively. The reflectance values for Ni/Au and Ni/Al, measured as in FIG. 9 at 260 nm were 25% and 70%, respectively.

Figure 13A:
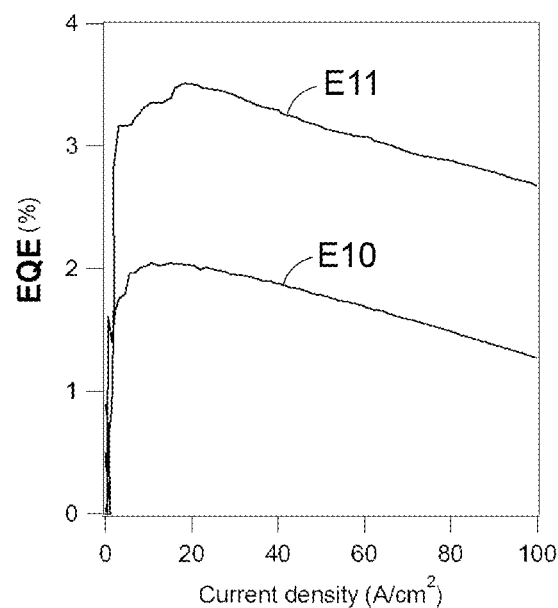
FIGS. 13A and 13B depicts graphs of measured data for samples adopting a p-type contact layer suitable for 260 nm wavelength emission with different structures used in the second electrodes in a working example of one embodiment as described herein.
Figure 13B:
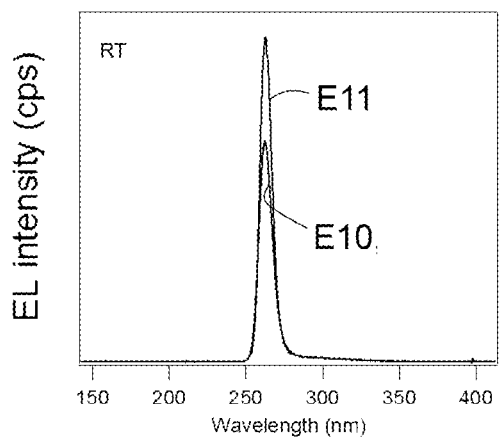

Operational performance measured for Example Samples E10 and E11 are shown in FIG. 13. FIG. 13A shows external quantum efficiencies $\eta_{EQE}$ as a function of current density, and FIG. 13B shows emission spectra when the external quantum efficiency $\eta_{EQE}$ is maximized. The external quantum efficiencies, or maximum values, for the samples are about 2% for Example Sample E10 with Ni/Au in the second electrode and about 3.2% or more for Example Sample E11 with Ni/Al in the second electrode. Accordingly, it has been confirmed that good operation was achieved for a design compatible with the emission wavelength of 260 nm in the present embodiment. The present inventors believe that a DUVLED operated with over 3% external quantum efficiency at 260 nm wavelength has not yet been reported.

Second Embodiment

Among structural variations for the second electrode of the LED element 100A described with reference to FIG. 9 in the first embodiment, the inventors of the present application paid attention to a single layer of Al that showed the highest reflectance. In order to utilize such a high reflectance, it is advantageous that a single layer of Al is adopted for the reflective electrode 160A, and then the Al single layer is disposed in direct contact with the p-type contact layer 15A. At the same time, to satisfy the ohmic contact condition, it is necessary that the insert metal layer 162, made of Ni or the like, should be placed where it directly contacts the p-type contact layer 150A. In consideration of such electric and optical requirements, the present inventors adopt a patterned insert metal layer, which will be a second embodiment in this disclosure.

Figures 14A, 14B:
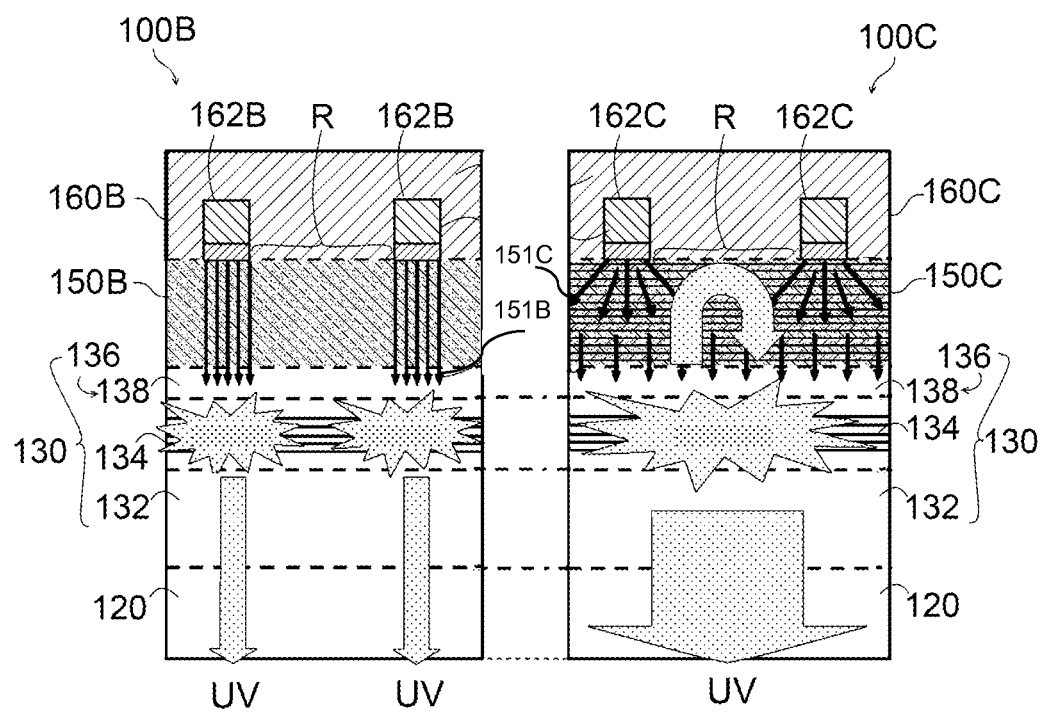
FIGS. 14A and 14B are schematic diagrams illustrating UV emission according to one embodiment as described herein.

FIG. 14 is a schematic diagram illustrating a feature of the present embodiment, in which the light extraction efficiency is improved. FIGS. 14A and 14B schematically illustrate structures of the LED elements 100B and 100C, which have the second electrodes with the insert metal layers 162B and 162C combined with the reflective electrodes 160B and 160C, respectively. The p-type contact layer 150B in the LED element 100B, shown in FIG. 14A, is a single layer film of uniform composition of p-type AlGaN, similarly as in the p-type contact layer 10A, shown in FIGS. 2 and 3, with a high transmittance or suppressed absorption of UV radiation. In contrast, FIG. 14B shows that the LED element 100C, used with the high-transmittance multilayer p-type contact layer 150C spreads the hole current, as depicted by black arrows. Structures for the combinations of the reflective electrode and insert metal layer in the LED elements 100B and 100C may be identical with each other. In addition, the p-type conduction layers 136 for the LED elements 100B and 100C are equipped with electron block layers 138 having an MQB structure. Other structural elements of the LED elements 100B and 100C, such as the structure for the ultraviolet emission layer 130 and the buffer layers 120, are similar to those for the LED element 100A.

Figure 15:
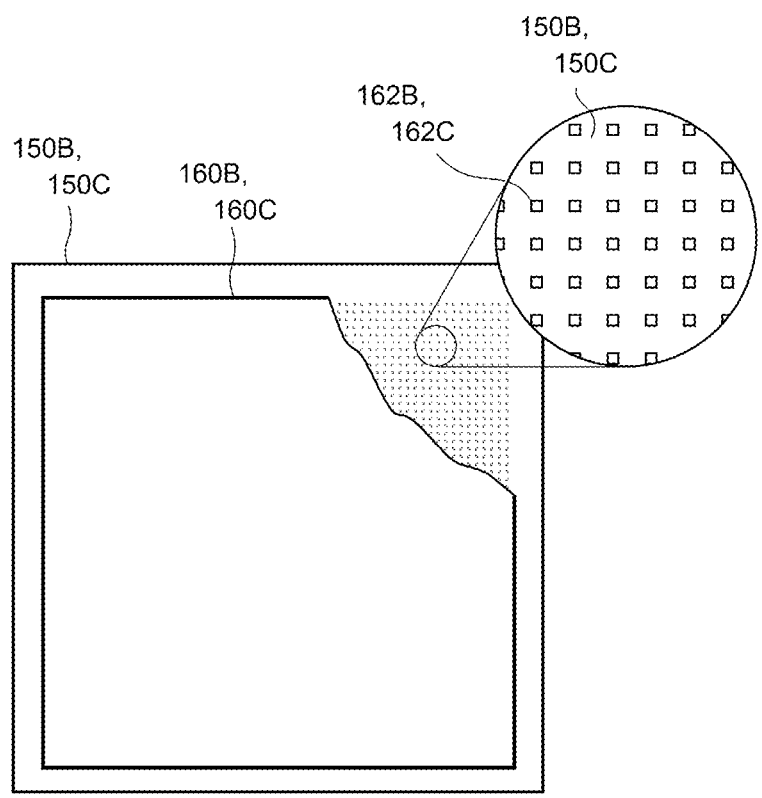
FIG. 15 is a plan view of an exemplary pattern of an insert metal layer according to one embodiment as described herein.

The structure and function will now be described regarding the second electrodes, which are combinations of the patterned insert metal layer 162B and 162C and reflective electrodes 160B and 160C, respectively. FIG. 15 is a plan view of an example pattern of the insert metal layer 162B, which is viewed from above, as shown in FIG. 14. Note that reference numerals for the LED element 100C are also indicated. The insert metal layer 162B is disposed and patterned, to cover only one or more portions of the p-type contact layer 150B. The insert metal layer 162B is formed in a dot pattern with small dot size, and is arranged into an array of a two-dimensional square lattice (see, FIG. 15, inset enlarge view). The insert metal layer 162B may be formed to have various patterns, in addition to the square lattice mentioned above, for example, an array of a two-dimensional triangular lattice, a stripe pattern of thin lines, or a grid pattern having crossed thin line stripes. Moreover, the insert metal layer 162B may be arranged into an array of a regular pattern, or an irregular pattern, such as randomly distributed dots. The reflective electrode 160B which includes Al as its principal component, makes direct contact with the p-type contact layer 150B at positions where the insert metal layer 162B is absent, and is electrically connected with the p-type contact layer 150B via the insert metal layer 162B at positions where the insert metal layer 162B is present.

The patterning process used to form the insert metal layer 162B can be practiced by any suitable technique. For example, lift-off and masked deposition technique can be used. The lift-off technique entails patterning a resist mask film with apertures disposed on the surface of the p-type contact layer 150B at the time when the surface is the outermost surface. Then a single or a multilayer metal film is deposited. Thereafter the resist mask film is removed together with the part of the metal film deposited thereon. This technique permits manufacturing the patterned insert metal film 162B based on the aperture pattern. In the case of masked deposition, a metal plate having apertures is used to cover the surface of the p-type contact layer 150B when it is the outermost surface for a mask, and then a single layer or multilayer metal film to be used for the insert metal 160B is deposited through the mask. This technique permits manufacturing the patterned insert metal film 162B based on the aperture pattern of the mask.

The functions of the reflective electrode 160B and the insert metal layer 162B are such that they establish ohmic contact between the insert metal layer 162B and the p-type contact layer 150B for ensuring electrical connection. On the other hand, in regions R (FIG. 14) where the p-type contact layer 150B directly contacts the lower interface of the reflective electrode 160B, UV radiation incident at the interface is reflected with high reflectance. In the LED element 100B, it is possible to substantially enhance the reflectance by increasing an area ratio of the region R. In this regard, the LED element 100B has improved light extraction efficiency compared with the LED elements 100 and 100A (FIGS. 2 and 3), which comprise the reflective electrodes 160 and 160A and the insert metal layer 162.

Specific dimensions are explained for illustrative purposes. The insert metal layer 162B is typically a patterned one of area 5 μm², arranged in a two-dimensional array having a square lattice pattern with 15 μm pitch. In this case, the area ratio of region R that gives direct contact between the reflective electrode 160B and the p-type contact layer 150B is 89%. Such values as the dot size and pitch, as well as the arrangement of the insert metal layer 162B, can be determined as necessary.

As stated above, when the LED element 100B has the structure shown in FIGS. 14 and 15, it is possible to ensure an electrical connection by the insert metal layer 162B while utilizing high reflectance of Al in the reflective electrode 160B.

The structure of the insert metal layer 162B in FIG. 14 has a multilayer Ni/Au, and the ohmic contact is established at the interface of the p-type contact layer 150B and Ni film. Thus, the patterned insert metal layer 162B adopted in the LED element 100B may be a single layer film or a multilayer film so long as it includes a metal suitable to make ohmic contact in the thickness position contacting directly to the p-type contact layer 150B. The structure and function of the second electrode of a combination of the reflective electrode and the insert metal layer also applies to the LED element 100C (FIG. 14B).

From now on, another attempt for utilizing the high reflectance of the reflective electrode 160B in the realistic operation is described. To enhance the reflectance, the p-type contact layer 150B in the LED element 100B has an increased AlN mixed crystal composition ratio and adopts a patterned insert metal layer 162B. However, depending on selected emission wavelength in the LED element 100B, the AlN mixed crystal composition ratio can be increased further, and the p-type contact layer 150B inevitably has a lesser conductivity. When the p-type contact layer 150B has less conductivity or higher resistivity, the hole current within the p-type contact layer 150B is constricted and concentrated into areas directly beneath the p-type contact layer 150B and in the vicinity of each insert metal layer 162B. Since the recombination of electrons and holes in the recombination layer 134 is also constricted and concentrated into the areas directly beneath the recombination layer 134 and in the vicinity of each of the insert metal layers 162B, the emission in the region R where the reflective electrode 160B is in direct contact with the p-type contact layer 150B becomes weak.

Note that it may be difficult to adopt the finest pattern for the insert metal layer 162B from a practical point of view. Moreover, the p-type contact layer 150B is manufactured to have around 100 nm thickness. Thus, there is a lower limit for shrinking the spacing between patterns of the insert metal layer 162B while keeping a large ratio of region R where the reflective electrode 162B and the p-type contact layer 150B are in direct contact with each other. It should be noted that the vertical direction in FIG. 14 is exaggerated compared to the horizontal direction. From this limitation it is difficult to enhance emission of the UV radiation by more frequent recombination in areas covering the region R in the ultraviolet emission layer 130. The absorption of the insert metal layer 162B would still have a more significant impact in comparison with the reduced area ratio of the insert metal layer 162B. It needs further modification in electric aspects for utilizing high reflectance of region R.

Therefore, the present inventors introduce a multilayer structure for p-type contact layer 150C in the LED element 100C, as indicated in the FIG. 14B. The p-type contact layer 150C is a multilayer structure of p-type AlGaN that is manufactured to have an alternating AlN mixed crystal composition ratio. The electric charge, or hole, in the p-type contact layer 150C propagates mainly in a thickness direction through the p-type contact layer 150C similarly as in the p-type contact layer 150B, as shown in FIG. 14A. The hole current 151C that passes through a number of layers of highs and lows in AlN mixed crystal composition ratio in the p-type contact layer 150C is spread in comparison with the case of the p-type contact layer 150B. That is, hole current 151B in the case of the p-type contact layer 150B propagates in a substantially straight direction through the thickness and flows, while being constricted, to directly beneath areas of the insert metal layer 162B, whereas hole current in the case of the multilayer p-type contact layer 150C flows while being spread in-plane directions. As a result, the hole current density in the case of the multilayer p-type contact layer 150C is leveled and spatial distribution of reproduction frequency in the recombination layer 134 is smoothed. Such spread of hole current 151C increases emission in high reflectance regions due to the reflective electrode 160C, as shown in FIG. 14B. It follows that the high reflectance property in the region R where the reflective electrode 160C and the p-type contact layer 150C are directly contacted with each other is effectively utilized.

Working Examples for the Second Embodiment

The concept of the Second Embodiment mentioned above will be described in more detail based on Working Examples.

Working Example 6

Figure 16A:
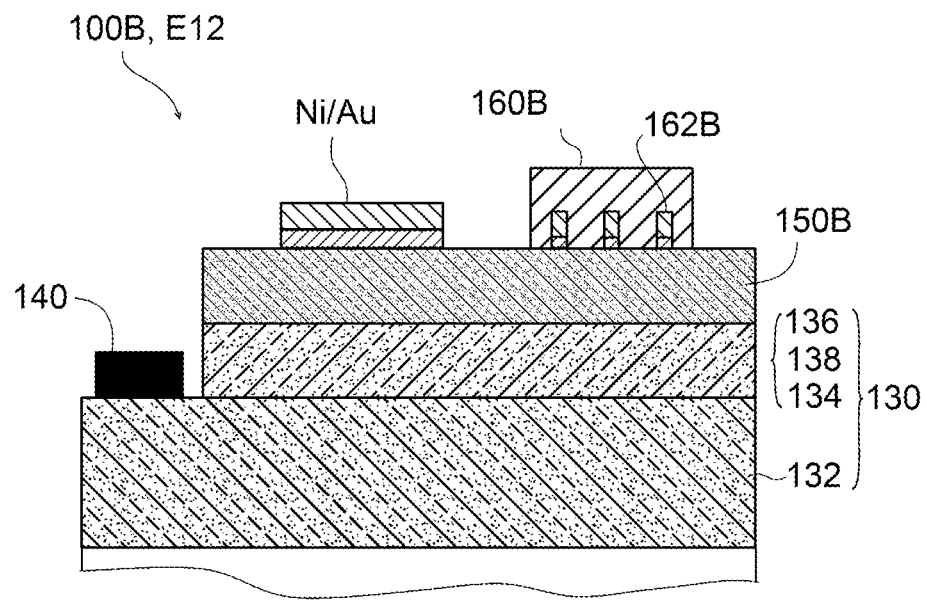
FIGS. 16A and 16B are cross-sectional views of the structure of LED elements in a working example of one embodiment, as described herein.
Figure 16B:
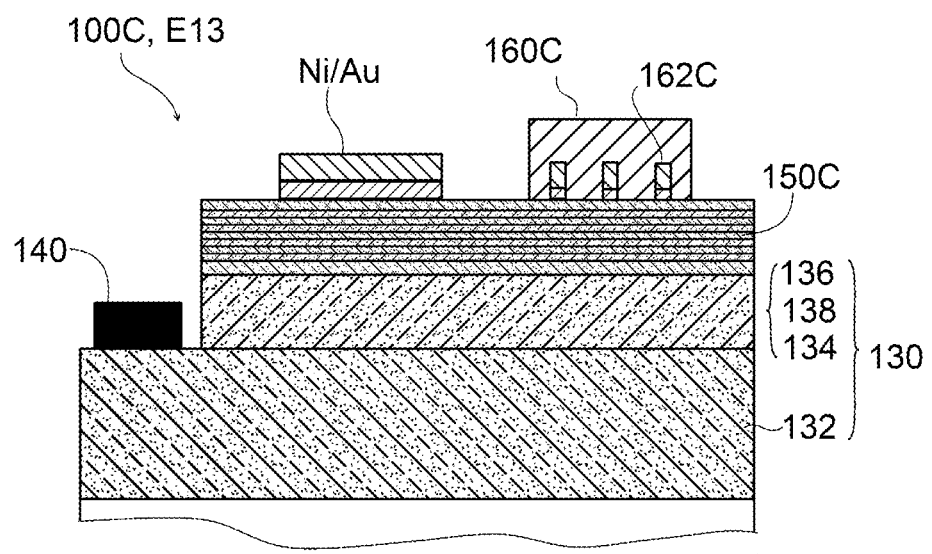

Working Example 6 for confirming effectiveness of our concept in the present embodiment is described. FIG. 16 shows cross-sectional views indicating structure of LED element samples for Working Example 6. FIGS. 16A and 16B depict Example Samples E12 and E13 for the LED elements 100B and 100C respectively. In each sample piece of element, two types of second electrodes are fabricated. These samples are prepared for easy comparison between performances by two types of second electrodes for estimating the light extraction efficiency in a similar fashion with the Working Example 4, and for allowing evaluation while preventing intervening effects caused by miscellaneous conditions other than the structural differences in the second electrode. These samples have a structure of Ni (5 nm)/Au (100 nm) for one of the two types of the second electrode, and the insert metal layers 162B and 162C with dot pattern Ni (5 nm)/Au (100 nm) with a 5 μm², two-dimensional square lattice of 15 μm pitch, covered by the reflective electrodes 160B and 160C of Al (100 nm) for the other type.

Detailed conditions for the Example Samples E12 and E13 for the LED elements 100B and 100C are as follows: For growing the LED elements 100B and 100C for Example Samples E12 and E13 with MOCVD methods, c-face sapphire substrates were adopted. The emission wavelengths for the Example Samples E12 and E13 were both 280 nm, and the structures for buffer layer 120, the n-type conduction layer 132, recombination layer 134, the p-type conduction layer 136 were the same as those explained with reference to FIG. 3. The p-type contact layer 150B for the Example Sample E12 was a single layer p-type AlGaN (hereinafter "bulk p-type AlGaN") of $Al_{0.66}Ga_{0.34}N$ composition with 100 nm thickness. In contrast, the p-type contact layer 150C of Example Sample E13 was a multilayer structure having an alternating stack of different AlN mixed crystal composition ratios of $Al_{0.73}Ga_{0.27}N$ and $Al_{0.66}Ga_{0.34}N$. These compositions were chosen because the averaged AlN mixed crystal composition ratio is identical to that for the p-type contact layer 150B. Alternating periodicity of thickness of the multilayer structure and variations or differences in the AlN mixed crystal composition ratio are optimized independently. The alternating periodicity for the stack for the p-type contact layer 150C in the Example Sample E13 was 20 nm with 90 nm total thickness (4.5 periods), which gave the best result in our tested conditions. Therefore, the p-type contact layer 150C had 5 layers of $Al_{0.73}Ga_{0.27}N$ and 4 layers of $Al_{0.66}Ga_{0.34}N$, and each of their thicknesses was 10 nm. Then the second electrode in FIG. 16 was formed for each sample. The two-dimensional shape of each of the second electrode was 0.4 mm×0.4 mm square.

Figure 17A:
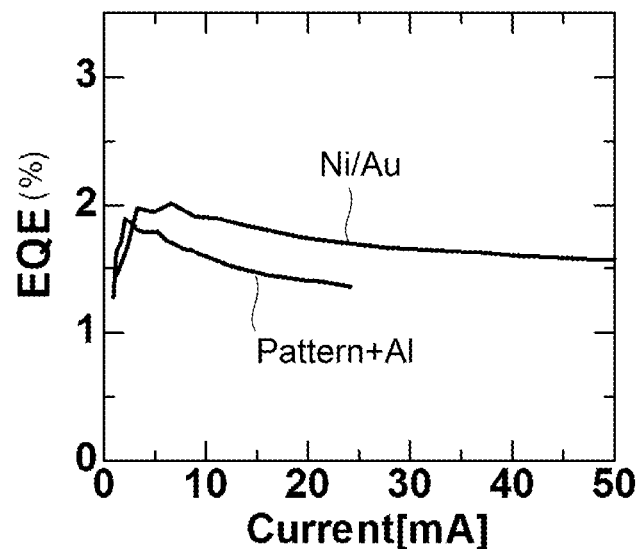
FIGS. 17A and 17B are graphs indicating dependence of the external quantum efficiency $\eta_{EQE}$ on electric current for a working example in one embodiment as described herein.
Figure 17B:
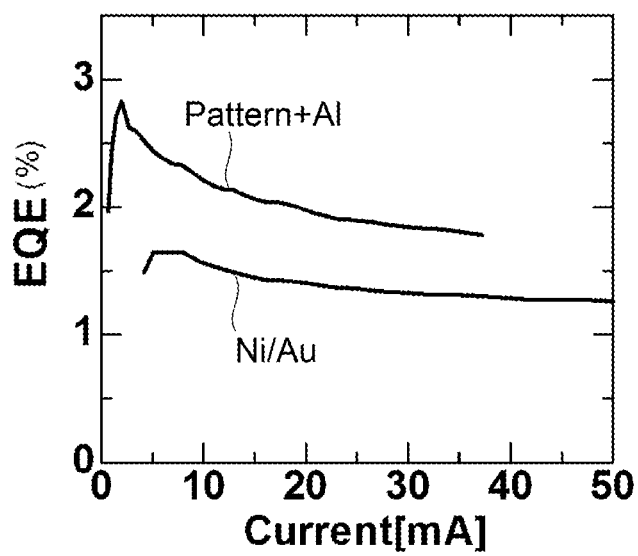

FIG. 17 shows graphs depicting dependence of the external quantum efficiency $\eta_{EQE}$ on electric current for this working example. FIGS. 17A and 17B are graphs for Example Samples E12 and E13 respectively, each of which indicates characteristics for two structures of the second electrodes. The Example Sample E12, which adopts bulk p-type AlGaN for the p-type contact layer 150B, had no substantial difference between maximum values for the external quantum efficiencies $\eta_{EQE}$ for the two second electrodes of Ni/Au area and patterned insert metal layer 162B with high reflective Al area. Thus the relative ratio between two maximum values for external quantum efficiencies $\eta_{EQE}$, or the light enhancement factor, was substantially 1 (FIG. 17A). In contrast, a maximum value of external quantum efficiency $\eta_{EQE}$ in the Example Sample E13, which adopts a layered structure p-type AlGaN for the p-type contact layer 150C, was significantly increased for an area of the second electrode with patterned insert metal layer 162B compared with the Ni/Au electrode. The corresponding light enhancement factor was around 1.5-1.6 (FIG. 17B). The experimental results based on the Example Samples E12 and E13 support our hypothesis that the multilayer structure of p-type AlGaN for the p-type contact layer 150C spreads hole current and the concentration of the hole current is mitigated. Furthermore, the technique of the present embodiment was demonstrated as a feasible one, which technique is to improve the extraction efficiency by the high reflectance of Al combined with spreading of hole current.

Variations

It is also desirable to practice variations of the embodiments described above. In particular, if the transmittance of the p-type contact layer 150A and the reflectance of the reflective electrode 160 are increased, then any measures for extracting light propagating inside of the LED element 100A in waveguide mode will work as intended. Besides, measures taken for electrical performance can be modified.

Variation 1

AlN Buffer Layer with Voids

One possible variation is fabrication of voids, or gaps, in the buffer layer. Voids may play several roles including refraction and scattering of light, which support the direction conversion capability for bending light propagation. FIG. 18 is a cross-sectional view showing a structure of an LED element in a variation of the first embodiment, in which voids V are formed. The voids V are provided through a crystal growth step for the buffer layer 120B. In a typical method for providing the voids, height differences are created in a surface of the sapphire substrate 110A by patterning. When the buffer layer 120B is grown, the growth rate is high where the sapphire substrate 110A is high, or at protrusions, and is low where the sapphire substrate 110A is low, or at recesses. It is possible to facilitate or suppress crystal growth with position selectivity during the growth process of the buffer layer 120B, by applying this phenomenon. Moreover, if a condition for facilitating crystal growth in a lateral direction, or in into direction in the plane of the surface, is adopted for the crystal growth condition of the buffer layer 120B, then a continuous, smooth crystal buffer layer 120B will be obtained in such a manner that the voids are closed and capped as the growth progresses. The buffer layer 120B to which the voids are fabricated will be able to bend the direction of light propagating along inclined directions outside the critical angle when the UV radiation is about to exit the LED element 100B, without loss of energy. When the p-type contact layer 150A, 150B, or 150C has significant absorption, light in waveguide modes should be absorbed if the light enters there. In the structure of the LED elements 100A, 100B, and 100C in the embodiments, the weak absorption property of the p-type contact layers 150A, 150B, and 150C contributes to extract light in waveguide modes, with the help of reflection by the second electrode, including the insert metal layer 162 and any of the reflective electrodes. The direction conversion capability of the voids may help improve the light extraction efficiency $\eta_{LEE}$ significantly when the p-type contact layer has less absorption.

A variety of fabrication methods can be applied to form the voids. The patterned difference in height on the surface of the sapphire substrate 110A mentioned above will form pillars 124 if a sea-islands pattern structure is adopted and islands are high areas, which results in formation of voids V between the pillars 124, as shown in FIG. 18. Conversely, if the sea area is high, hollows corresponding to islands areas will be formed and such hollows will become the voids. Since crystal lattice symmetry is maintained during the growth of the buffer layer 120B, in-plane cross-sectional shapes of pillars or voids may have sides and vertexes. Other patterns such as stripe patterns or arbitrary patterns can be formed. Furthermore, instead of having the difference in height, the same function is achieved if a patterned film is formed on the sapphire substrate 110A as a mask, wherein the film is an obstacle to subsequent growth of the crystal.

It is preferable to remove sapphire substrate 110A in the case when voids V are formed in the buffer layer 120B. FIG. 18 indicates positions using a dotted line where the sapphire substrate 110A is removed on the pillars 125 near the sapphire substrate 110A. When voids V in the buffer layer 120B are exposed to the surface by removing the sapphire substrate 110A, the void structure diminishes the total amount of light returning back to the inside due to, for example, total internal reflection or surface reflection. When the substrate is removed in the case wherein the buffer layer 120 has connected pillars, each pillar will act as a waveguide, and UV radiation passes inside of each pillar when UV light is extracted and emitted to the outside, which reduces the amount of light affected by total internal reflection and surface reflection and increases the light extraction efficiency $\eta_{LEE}$. Also, depending on the sizes of the pillars or the direction of propagation, it may be possible that the impedance at the interface for the UV radiation is reduced when exiting to the outside similarly as in a moss-eye structure, as described below. In any case, the amount of light affected by total internal reflection or surface reflection will be reduced.

Variation 2

Moss-Eye Structure

In the embodiments, transmittance increase of the p-type contact layer and another approach that would increase the light extraction efficiency $\eta_{LEE}$ can be practiced together. To increase the light extraction efficiency $\eta_{LEE}$, light emitted into the second electrode side from the ultraviolet emission layer 130 or light propagating in a waveguide mode should be extracted to the outside in the end. When a moss-eye structure is formed on a surface opposite the second electrode of the LED element, or on any other surface or interface that accompanies an index step among other surfaces, it is possible to reduce the amount of light returning back to the inside when they exit. Therefore such an arrangement is desirable. Surfaces and interfaces where the moss-eye may be provided include an outermost surface opposite the second electrode, such as the optical output surface 102 of the substrate 110, and an interface of the LED element and UV transmissive media if the LED element is encapsulated by the UV transmissive media, such as a resin or a glassy transmissive material. It is desirable that the moss-eye structure is formed on any of the surfaces or interfaces that have a significant step in the refractive index. The moss-eye structure denotes a structure having a surface contour of any shape with undulating profiles smaller than the wavelength, which suppresses reflection that should have been caused by the index step, due to the surface contour. In such a structure, the impedance for the UV radiation is reduced at the interface with the index step when the radiation exits to the outside, which results in reduction of the surface reflection.

Variation 3

Structure in Electron Block Layer

Another example of the embodiments mentioned above is now described, concerning its electron block layer. A scheme for increasing the electron injection efficiency $\eta_{EIE}$ may be important for the embodiments that improve the light extraction efficiency $\eta_{LEE}$ because such a scheme improves the external quantum efficiency $\eta_{EQE}$ in the end. Among others, since hole concentration of the p-type contact layer 150A is sacrificed in place of transmittance improvement, the practicability of the embodiment depends on whether or not there is applicable measure for compensating reduction of the electron injection efficiency $\eta_{EIE}$. The electron block layer 138 provided in the p-type conduction layer 136 is effective for the measure of increasing the electron injection efficiency $\eta_{EIE}$, as described earlier.

In general, the longer the emission wavelength becomes within the ultraviolet range, the longer the composition wavelength of the p-type contact layer 150A becomes. Hence, the AlN mixed crystal composition ratio x for the p-type conduction layer 136 may be kept low. Accordingly, in such a case, the problem of the hole concentration may not be so serious. In the case of the embodiments when the wavelength becomes shorter, AlN mixed crystal composition ratio x of the p-type conductive layer 136 or the p-type contact layer 150A needs to be increased, and the hole concentration is sacrificed accordingly; thus the impact on the electron injection efficiency $\eta_{EIE}$ becomes serious. Consequently, the need for adopting the electron block layer 138 is heightened. Depending on the wavelength, a single barrier structure provided with a single layer of high Al composition ratio may be sufficient. If the crystal orientation is one accompanied by polarization, a relatively simple single barrier structure might have sufficient electron blocking performance. When the emission wavelength becomes shorter, adopting an MQB or carefully optimizing the MQB as needed should be suitable solutions, because MQB has more efficient electron blocking performance than the single barrier structure. In particular, MQB that uses a multiple reflection effect allows minimizing the increase of the Al mixed crystal composition ratio for the electron block layer in the p-type conduction layer while establishing electrical connection. Thus, the MQB is preferable for the embodiments when the reduction of the electron injection efficiency $\eta_{EIE}$ needs to be compensated. It should be noted that, for the wavelength range of sterilization purposes, e.g., 260-280 nm, using single barrier structure and adopting MQB as in the Working Example are both advantageous.

It is important that, with regard to side effects that may be brought about by the p-type contact layer with increased transmittance for improving the light extraction efficiency, a solution has been already presented and that its effectiveness has been already confirmed in the embodiments of the present invention. Moreover, it is preferable that the period of the Al mixed crystal composition ratio modulation, or period of the thickness direction, is changed, or chirped for improving the MQB function. The details of MQB including the chirp are described in H. Hirayama et al., "222-282 nm AlGaN and InAlGaN-based deep-UV LEDs fabricated on high-quality AlN on sapphire," Phys. Stat. Solidi (a), 206, 1176, (2009).

Variation 4

Introduction of In into P-Type Layers

It is advantageous as a variation to the embodiments that indium (In) is introduced into any p-type layer whose carrier (hole) concentration tends to be decreased, including the p-type conduction layer 136, the electron block layer 138 that may be provided optionally, and the p-type contact layer 150A. The present inventors have confirmed that a p-type InAlGaN layer has higher carrier concentration due to the introduction of In, (S, Fujikawa, T. Takano, Y. Kondo and H. Hirayama, "Realization of 340-nm-band high-output-power (7 mW) InAlGaN quantum well ultraviolet light-emitting diode with p-type InAlGaN", Jap. J. Appl. Phys. 47, 2941 (2008)). In particular, it is preferable that adopting a p-type InAlGaN layer, to which In was introduced with a concentration in a range from as low as a doping level of $1 \times 10^{18}$ cm$^{-3}$ to around 2%. In the p-type contact layer 150A having such composition, the composition wavelength is substantially determined by the AlN mixed crystal composition ratio, while the transmittance over a wavelength range longer than the composition wavelength will not be affected. Thus, the above description of the embodiments applies to the p-type conduction layer 136, the electron block layer 138, and the p-type contact layer 150A, with substantially no change for this variation. Introduction of In can be carried out by adding appropriate dose of such material gas as trimethylindium-diisopropylamine-adduct (TMIn-adduct) at an appropriate timing.

Variation 5

Introduction of In into Ultraviolet Emission Layer

It is advantageous that In is introduced into an ultraviolet emission layer, especially into the recombination layer 134. The present inventors confirmed that, by adding In of, for example, around 0.3% into the composition of mixed crystal of AlN and GaN for the ultraviolet emission layer 130 or the recombination layer 134, internal quantum efficiency of quantum wells emitting at around 280 nm was enhanced (H. Hirayama et al., "222-282 nm AlGaN and InAlGaN-based deep-UV LEDs fabricated on high-quality AlN on sapphire," Phys. Stat. Solidi (a), 206, 1176, (2009)). The mechanism causing such behavior appears to be that composition fluctuation or modulation of In in AlGaN causes carrier localization, and as a result, the fraction of electrons and holes contributing to recombination is increased, which suppresses loss due to nonradiative recombination at crystal defects of threading dislocations. In this variation, it is advantageous to introduce In at a concentration in a range from as a low as doping level, or $1 \times 10^{18}$ cm$^{-3}$ to around 2% at the maximum.

Variation 6

AlN Crystal Substrate

In a variation of the embodiments, an AlN crystal substrate can be adopted in place of the sapphire substrate 110 mentioned above. In this variation, the buffer layer 120 made of AlN crystal may be omitted. The ultraviolet emission layer 130 is disposed in contact with the AlN crystal or a buffer layer, if present, and is formed by epitaxial growth. When the AlN crystal substrate is adopted, increasing transmittance of the p-type contact layer and increasing reflectance of the second electrode, or reflective electrode, improves the light extraction efficiency, which should contribute to improvement of the external quantum efficiency. Therefore, all descriptions set forth herein assuming the sapphire substrate 110 also apply to the variation with the AlN crystal substrate.

Variation 7

Improvement of Electric Performance

Figure 19:
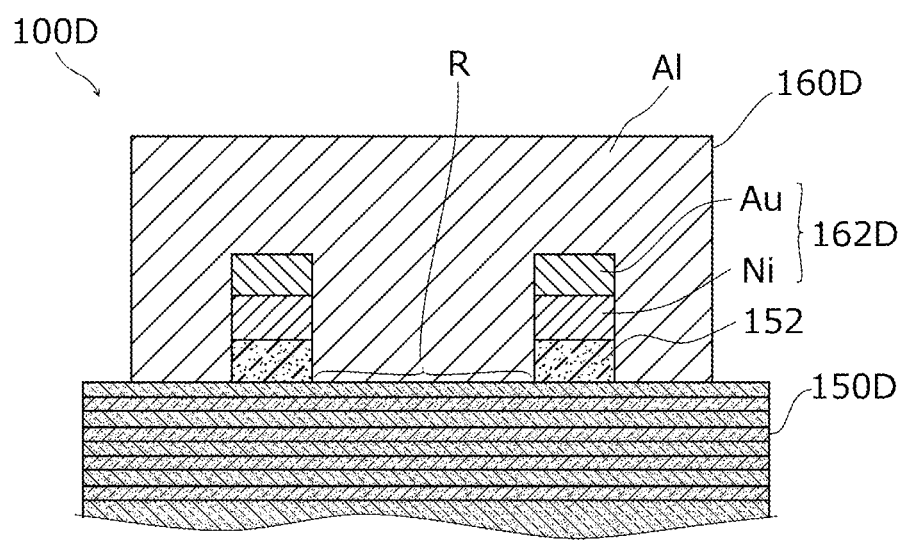
FIG. 19 is an enlarged cross-sectional view indicating an example structure of LED elements in one embodiment as described herein. An exemplary structure is shown, of a patterned p-type GaN layer interposed between a Ni layer of an inset metal layer and a p-type contact layer.

In the LED element 100C (FIG. 14B) that has a patterned insert metal layer 160C and a p-type contact layer 150C explained above in the second embodiment, it is possible to obtain further practicability by improving the electric performance. The variation for the improvement is to add a patterned p-type GaN layer to an interface between the multilayer p-type contact layer and the patterned insert metal layer in such a manner that the patterned p-type GaN layer directly contacts with them. FIG. 19 is an enlarged cross-sectional view indicating an example structure of such an LED element, an LED element 100D, while depicting an exemplary structure with a patterned p-type GaN layer 152 interposed between a Ni layer in an inset metal layer 162D and a p-type contact layer 150D formed into a layered structure. The reflective electrode 160D caps the patterned p-type GaN layer 152 and the insert metal layer 162D. The structure is completed by forming an Al layer with high reflectance provided by the direct contact region R with the p-type contact layer 150D where neither the insert metal layer 162D nor the p-type GaN layer 152 is present.

The material of the p-type GaN layer 152 is made of gallium nitride doped with magnesium (GaN; Mg), referred to as p-type GaN. Optical absorption may become a problem for the p-type GaN as described above in connection with the p-type contact layer 150 of the conventional LED element 100. However, the practical disadvantage in the optical aspect is limited if the p-type GaN layer 152 is patterned and the arrangement of the patterned p-type GaN layer 152 conforms to the pattern of the insert metal layer 162D as in FIG. 19. This is because contribution of the reflectance of the patterned insert metal layer 162D to the light extraction efficiency $\eta_{LEE}$ is small in origin, and the absorption of light by the p-type GaN layer 152 arranged according to the insert metal layer 162D has limited impact on the overall reflectance.

In contrast, the advantage in electrical performance due to the p-type GaN layer 152 is significant. A contact potential difference between the Ni layer in the patterned insert metal layer 162D and the p-type contact layer 150D can be reduced by 5V or so if the p-type GaN layer 152 is interposed therebetween, compared with the direct contact arrangement. This is because the p-type GaN layer 152 interposed between the Ni layer in the insert metal layer 162D and the p-type contact layer 150D exhibits degenerated semiconductor layer behavior, or p+ layer, which helps to establish ohmic contact. Such reduction of the contact potential difference diminishes joule heat generated by holes carrying the electric current. Electric power efficiency is thereby improved while suppressing heat dissipation. The electric power efficiency in this context is defined by a ratio between output emission energy per time divided by input electric power.

The patterning process for the p-type GaN layer 162 for such a structure can be easily carried out by, for example, an etching technique utilizing patterned resist film with photolithography before fabrication of the patterned insert metal layer 162D. Patterning the p-type GaN layer 152 can be performed using an arbitrary patterning technique. Typically, dry etching using a photoresist mask made by a photolithography technique is adopted. The patterning for the patterned insert metal layer 162D can be carried out similarly as that for the patterned insert metal layer 162C (FIG. 16B). The two-dimensional arrangement of the patterned p-type GaN layer 152 may be similar to that of the patterned insert metal layer 162D as indicated in FIG. 19, wherein the arrangements need not be identical. The intended improvement of the electric performance can be achieved if at least a part of the patterned p-type GaN layer 152 is interposed between the p-type contact layer 150D and the patterned insert metal layer 162D, and the part of the patterned p-type GaN layer 152 is in direct contact with both of them. It should be noted that, although a layered Ni/Au type electrode is shown as the patterned insert metal layer 162D in the figures, the Au layer is not always required, as in the case of the insert metal layer 162C. Therefore, a single layer of Ni can be used. As a result of significant improvement of the electric power efficiency of OED element 100D can be realized compared with the LED element 100C, while the high reflectance of region R is utilized.

Variation 8

Application to Electrical Apparatus

Ultraviolet radiation emitters with improved efficiency obtained by LED element 100A-100D of the embodiments described herein will also improve utility of appliances using the same. The appliances are not limited to any specific ones. Non-limiting examples of such appliances include a sterilization apparatus, a water purification device, a chemical decomposition device including a exhaust gas cleaner, and an information record/playback device. When such appliances are operated, a highly efficient ultraviolet radiation emitter will reduce electric power for their operation, environmental burden, and operation cost. In addition, when the efficiency of the emitters is improved, the number of emitters in the appliance can be reduced, and related mechanisms such as devices for heat dissipation and operation power sources can be simplified. These contribute to reductions of size and weight, as well as cost reduction.

As described above, when variations to increase transmittance of the p-type contact layer and other variations can be applied to the embodiments disclosed, the practicability of the DUVLED will be improved due to increase of the external quantum efficiency of the DUVLED.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

INDUSTRIAL APPLICABILITY

The ultraviolet light-emitting diode of the present invention is applicable to any electric appliances that use ultraviolet radiation.

REFERENCE SIGNS LIST 100, 100A-100D LED element (DUVLED)
102 optical output surface
104 one surface of substrate
110, 110A substrate
120, 120B buffer layer
130 ultraviolet emission layer
132 n-type conduction layer
134 recombination layer
136 p-type conduction layer
140 first electrode
150 p-type contact layer
150A p-type contact layer (high transmittance)
150B p-type contact layer (bulk p-type AlGaN)
150C p-type contact layer (multilayer)
152 patterned p-type GaN layer
160 reflective electrode
160A reflective electrode (high reflectance)
160B-160D reflective electrode (high reflectance, Al)
162 insert metal layer
162B-162D patterned insert metal layer

What is claimed is:

1. An ultraviolet light-emitting diode comprising:
a single crystalline substrate;
an ultraviolet emission layer made of a mixed crystal having components of AlN and GaN, the ultraviolet emission layer disposed in contact with the substrate, the ultraviolet emission layer including
an n-type conductive layer;
a recombination layer on the n-type conduction layer; and
a p-type conduction layer on the recombination layer;
a p-type contact layer of mixed crystal of AlN and GaN, the p-type contact layer being electrically connected with the p-type conduction layer; and
a reflective electrode that reflects UV radiation emitted from the ultraviolet emission layer, wherein the reflective electrode is electrically coupled to the p-type contact layer.

2. The ultraviolet light-emitting diode according to claim 1, wherein the p-type contact layer has a transmittance of 90% or more when the UV radiation makes a single-pass transmission through the p-type contact layer.

3. The ultraviolet light-emitting diode according to claim 2, wherein the transmittance is 95% or more.

4. The ultraviolet light-emitting diode according to claim 1, wherein the p-type conduction layer has an electron blocking layer.

5. The ultraviolet light-emitting diode according to claim 4, wherein the electron blocking layer has a multi-quantum barrier structure.

6. The ultraviolet light-emitting diode according to claim 1, wherein material of the p-type contact layer has a compositional wavelength that is shorter than a principal wavelength of the UV radiation.

7. The ultraviolet light-emitting diode according to claim 1, wherein an AlN mixed crystal composition ratio x in a composition $Al_xGa_{1-x}N$ the p-type contact layer is greater than or equal to a lower limit $x_{min}$ given by $$x_{min} = -0.006W + 2.26,$$

wherein W denotes a principal wavelength of the UV radiation in units of nm.

8. The ultraviolet light-emitting diode according to claim 7 wherein the AlN mixed crystal composition ratio is 0.7, and wherein the principal wavelength of the UV radiation is 260 nm.

9. The ultraviolet light-emitting diode according to claim 1, wherein the reflective electrode is a metal film consisting primarily of Al, and
wherein the ultraviolet light-emitting diode is provided with an insert metal layer for realizing ohmic contact, the insert metal layer being interposed between the p-type contact layer and the metal film.

10. The ultraviolet light-emitting diode according to claim 9, wherein the insert metal layer is a Ni film having a thickness smaller than 5 nm.

11. The ultraviolet light-emitting diode according to claim 9, wherein the insert metal layer is a Ni film having a thickness of approximately 1 nm.

12. The ultraviolet light-emitting diode according to claim 9, wherein the insert metal layer is disposed on the p-type contact layer, a part of the p-type contact layer being covered therewith,
wherein the reflective electrode is placed in direct contact with the p-type contact layer wherever the insert metal layer is absent, and
wherein the reflective electrode is placed on the p-type contact layer, the insert metal layer being interposed therebetween wherever the metal insert is present.

13. The ultraviolet light-emitting diode according to claim 12, wherein the insert metal layer is either a single-layer metal or a multilayer metal having at least a Ni layer in proximity to the p-type contact layer.

14. The ultraviolet light-emitting diode according to claim 12, wherein the p-type contact layer is configured to have a layered structure in which layers with different AlN mixed crystal composition ratio are stacked with each other,
whereby holes propagating through the p-type contact layer from the patterned insert metal layer to the p-type conductive layer are spread toward in-plane directions of the substrate.

15. The ultraviolet light-emitting diode according to claim 14, further comprising a patterned p-type GaN layer,
wherein a portion of the patterned p-type GaN layer is in direct contact with, and interposed between, the p-type contact layer of the layered structure and the patterned insert metal layer.

16. The ultraviolet light-emitting diode according to claim 1, wherein the ultraviolet light-emitting diode is provided with the additional buffer layer, and
wherein the additional buffer layer has voids.

17. The ultraviolet light-emitting diode according to claim 16, wherein the substrate is removed.

18. The ultraviolet light-emitting diode according to claim 1, wherein the UV radiation has a principal wavelength in the range of 260-280 nm.

19. The ultraviolet light-emitting diode according to claim 1, wherein material of the mixed crystal of AlN and GaN for any of the p-type conductive layer and the p-type contact layer further includes indium.

20. An electric apparatus having the ultraviolet light-emitting diode according to claim 1 as an ultraviolet emitter.

21. The diode of claim 1 wherein the substrate includes one or more of sapphire and aluminum nitride.

22. The diode of claim 1, further comprising a buffer layer on the substrate.

* * * * *